(12) United States Patent
Wu et al.

(10) Patent No.: US 9,799,694 B2
(45) Date of Patent: Oct. 24, 2017

(54) BACKSIDE THROUGH VIAS IN A BONDED STRUCTURE

(71) Applicant: Taiwan Semiconductor Manufacturing Company, Ltd., Hsin-Chu (TW)

(72) Inventors: Weng-Jin Wu, Hsin-Chu (TW); Ku-Feng Yang, Baoshan Township (TW); Hung-Pin Chang, Taipei (TW); Wen-Chih Chiou, Zhunan Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/051,455

(22) Filed: Feb. 23, 2016

(65) Prior Publication Data

US 2016/0172403 A1 Jun. 16, 2016

Related U.S. Application Data

(60) Division of application No. 14/263,520, filed on Apr. 28, 2014, now Pat. No. 9,293,418, which is a
(Continued)

(51) Int. Cl.
*H01L 21/66* (2006.01)
*H01L 27/146* (2006.01)
(Continued)

(52) U.S. Cl.
CPC ........ *H01L 27/14634* (2013.01); *B24B 7/228* (2013.01); *B24B 37/013* (2013.01); *H01L 21/304* (2013.01); *H01L 21/30625* (2013.01); *H01L 21/76898* (2013.01); *H01L 22/26* (2013.01); *H01L 22/30* (2013.01); *H01L 23/481* (2013.01); *H01L 23/528* (2013.01); *H01L 23/5226* (2013.01); *H01L 23/5384* (2013.01); *H01L 25/50* (2013.01); *H01L 27/1464* (2013.01); *H01L 27/14636* (2013.01);
(Continued)

(58) Field of Classification Search
None
See application file for complete search history.

(56) References Cited

U.S. PATENT DOCUMENTS 6,546,820 B1 4/2003 Van et al.
6,811,853 B1 11/2004 Sherrer et al.
(Continued)

*Primary Examiner* — Shaun Campbell
(74) *Attorney, Agent, or Firm* — Slater Matsil, LLP

(57) ABSTRACT

A wafer thinning system and method are disclosed that includes grinding away substrate material from a backside of a semiconductor device. A current change is detected in a grinding device responsive to exposure of a first set of device structures through the substrate material, where the grinding is stopped in response to the detected current change. Polishing repairs the surface and continues to remove an additional amount of the substrate material. Exposure of one or more additional sets of device structures through the substrate material is monitored to determine the additional amount of substrate material to remove, where the additional sets of device structures are located in the semiconductor device at a known depth different than the first set.

20 Claims, 19 Drawing Sheets

Related U.S. Application Data continuation-in-part of application No. 11/773,171, filed on Jul. 3, 2007, now abandoned.

(51) Int. Cl.

| | |
|---|---|
| *H01L 23/538* | (2006.01) |
| *B24B 37/013* | (2012.01) |
| *B24B 7/22* | (2006.01) |
| *H01L 21/304* | (2006.01) |
| *H01L 21/306* | (2006.01) |
| *H01L 21/768* | (2006.01) |
| *H01L 23/522* | (2006.01) |
| *H01L 23/528* | (2006.01) |
| *H01L 23/48* | (2006.01) |
| *H01L 25/00* | (2006.01) |

(52) U.S. Cl.
CPC ........ *H01L 21/76805* (2013.01); *H01L 22/12* (2013.01); *H01L 22/14* (2013.01); *H01L 22/34* (2013.01); *H01L 2924/0002* (2013.01)

(56) References Cited

U.S. PATENT DOCUMENTS

| | | |
|---|---|---|
| 6,930,382 B2 | 8/2005 | Sawada et al. |
| 7,090,562 B1 | 8/2006 | Boyd et al. |
| 8,916,471 B1 | 12/2014 | Yang et al. |
| 2004/0237413 A1 | 12/2004 | Shida et al. |
| 2005/0158889 A1 | 7/2005 | Brouillette et al. |
| 2006/0172666 A1 | 8/2006 | Hikita et al. |
| 2007/0090490 A1 | 4/2007 | Chang et al. |
| 2011/0233702 A1* | 9/2011 | Takahashi ......... H01L 21/76898 257/432 |
| 2011/0266691 A1 | 11/2011 | Lin et al. |
| 2012/0193785 A1* | 8/2012 | Lin .................. H01L 21/76229 257/737 |
| 2013/0264688 A1* | 10/2013 | Qian ................ H01L 21/76898 257/622 |
| 2013/0321680 A1* | 12/2013 | Kumano ........... H01L 21/76807 348/273 |

* cited by examiner

BACKSIDE THROUGH VIAS IN A BONDED STRUCTURE

CROSS-REFERENCE TO RELATED APPLICATIONS

This application is a divisional of, and claims the benefit of, U.S. patent application Ser. No. 14/263,520, filed on Apr. 28, 2014, entitled "Backside Through Vias in a Bonded Structure," which is a continuation-in-part of U.S. patent application Ser. No. 11/773,171, filed on Jul. 3, 2007, entitled "Thickness Indicators for Wafer Thinning," both of which applications are incorporated herein in their entireties by reference.

BACKGROUND

A semiconductor wafer generally includes a first or "front" side having integrated circuits formed thereon, and a backside comprising a thickness of a semiconductor material (e.g., silicon (Si), gallium arsenide (GaAs), or the like) either in a bulk Si/semiconductor wafer or a Si/semiconductor on insulator (SOI) package. Prior to the dicing and packaging of the individual integrated circuit chips, the backside of the wafer is typically thinned to remove unwanted semiconductor material.

There are several different bonding and wafer thinning processes that are currently used depending on the type of semiconductor substrate (e.g., SOI vs. bulk Si) or on the point in a process at which vias are formed (i.e., before or after bonding). When using SOI substrates, the typical procedure temporarily bonds the first wafer die to a glass layer. The backside of the SOI wafer is then usually wet etched to an etch stop layer leaving the backside substrate around 1.8 µm thick. The etched wafer die is then bonded to another wafer, after which the glass layer is removed from the first wafer die. Once the multiple layers are bonded, vias are formed to establish interlayer connections.

When bulk Si is used, one method begins with a first wafer die that includes back-end-of-the-line (BEOL) connections. This first wafer die is bonded to a surface of another wafer, after which the backside substrate is thinned. Once the thinning process is completed, vias are then formed to establish interlayer connections.

A second method used in bulk Si wafers forms vias before the bonding process. In this method, the first wafer die not only includes the active device connections, but also has the interconnecting vias formed. After bonding to another wafer, the backside thinning works to expose backside connections to the pre-fabricated vias.

The backside grinding process reduces the thickness of the integrated circuit chips, allows smaller packaging, provides better stress performance in laminated packages, and provides other known benefits. Existing control methods for backside grinding typically rely on the mechanical precision of the grinding tool to control the accuracy of the final thickness of the wafer. For ultra-thin three-dimensional (3D) integrated circuit (IC) wafers, the backside may be thinned to between 20-30 µm. Such thickness requirements may risk damage to the active device layer if the mechanism to determine material thickness during the backside grinding process is not accurate.

Existing methods for controlling the mechanical backside grinding process typically use a mechanical thickness dial gauge to identify the specific width or thickness for the grinding element to leave intact. However, because the dial gauge itself is a mechanical process, its accuracy is intrinsically limited. FIGS. 1A-1C are cross-sectional diagrams illustrating a typical wafer grinding process. In FIG. 1A, semiconductor die 10, including, among other things, bulk Si 100, through Si via (TSV) 101, and passivation layer 102, is bonded to semiconductor die 11, including, among other things, bulk Si 104 and passivation layer 103. After semiconductor dies 10 and 11 are bonded together to form stacked die 12, as illustrated in FIG. 1B, processing machine 13 applies grinding surface 105 to grind away much of bulk Si 100 from stacked die 12. The thickness dial gauge (not shown) of processing machine 13 is set to stop grinding bulk Si 100 at a desired coarse thickness, typically between 50 and 30 µm.

Because the grinding process provides such a coarse grinding mechanism, the top most layer of Si of stacked wafer 12 is typically damaged, which generally prompts additional fine polishing to finish the processing. Chemical mechanical polishing (CMP) or the like is usually performed over the damaged surface to create a more useful planarized surface in addition to more finely thinning stacked wafer 12. FIG. 1C illustrates processing machine 13 applying polishing surface 106 to continue finely thinning and repairing the top surface of stacked wafer 12. CMP is continued until the thickness of bulk Si 100 reaches the desired amount, typically between 30 and 20 µm. Once this desired thickness is reached, TSV 101 is usually exposed for external connection to stacked wafer 12. During the CMP process, endpoint detection (EPD) is generally needed to detect the desired endpoint of the thinning. This EPD may be implemented through a time control (i.e., conducting CMP for a specified time which, in consideration of the polishing rate, should indicate a depth that the polishing will provide after the specified time). It may also be implemented through some type of optical metrology, including optical microscopes (OM), infrared (IR) measurement, laser detection, or similar optical measurement systems.

The precise control to implement the accuracy of the grinding/thinning process is, therefore, limited by the accuracy of the mechanical thickness dial, followed by complicated optical verification systems. If the dial cannot sufficiently control the exact depth desired, grinding may actually cross into an active device area, potentially ruining the operability of the semiconductor device.

One method that was developed to overcome the problems in the grinding portion of wafer thinning is described in U.S. Patent Publication No.: 2005/0158889 by Brouillette, et al., (hereinafter "Brouillette"). Instead of relying on a mechanical thickness dial, the thickness of the semiconductor wafer is measured using optical metrology. Specifically, IR light is directed onto the semiconductor wafer. Based on the reflective and refractive properties of the semiconductor material, the system analyzes the reflected IR light wavelengths to determine the thickness of the wafer. However, while the Brouillette method provides wafer measurement without the use of physically-limited mechanical dials, the costs of the optical equipment is generally quite high. Moreover, the grinding process is typically halted each time an IR measurement takes place. Therefore, the grinding process is slowed decreasing the overall though-put of the manufacturing process. Further still, because the grinding process is halted to perform the measurement, care is still warranted to prevent grinding into the active layers of the wafer between measurements.

BRIEF DESCRIPTION OF THE DRAWINGS

For a more complete understanding of various representative embodiments, and advantages thereof, reference is made to the following descriptions taken in conjunction with the accompanying drawings, in which.

DETAILED DESCRIPTION OF ILLUSTRATIVE EMBODIMENTS

The making and using of various representative embodiments are discussed in detail below. It should be appreciated, however, that there are many applicable inventive concepts that can be embodied in a wide variety of contexts. Described embodiments are merely illustrative, and do not limit the scope of the disclosure.

Embodiments herein will be described with respect to a representative context, namely a two-layer 3D IC semiconductor device with TSVs formed as thickness indicators. The disclosed embodiments may also be applied, however, to various other multilayer semiconductor devices, and the thickness indicators may be any type of device structure, such as trenches, TSVs, alignment marks, combinations thereof, and/or the like.

Figure 1A:
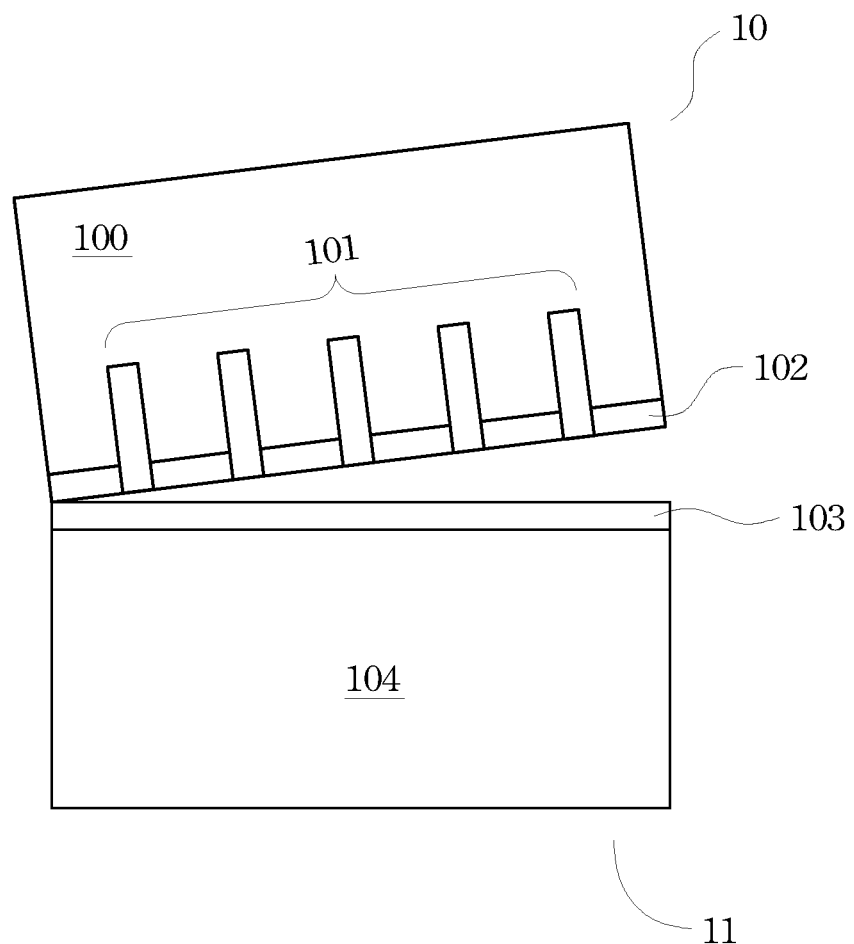
FIGS. 1A-1C are cross-sectional diagrams illustrating a conventional wafer grinding process.
Figure 1B:
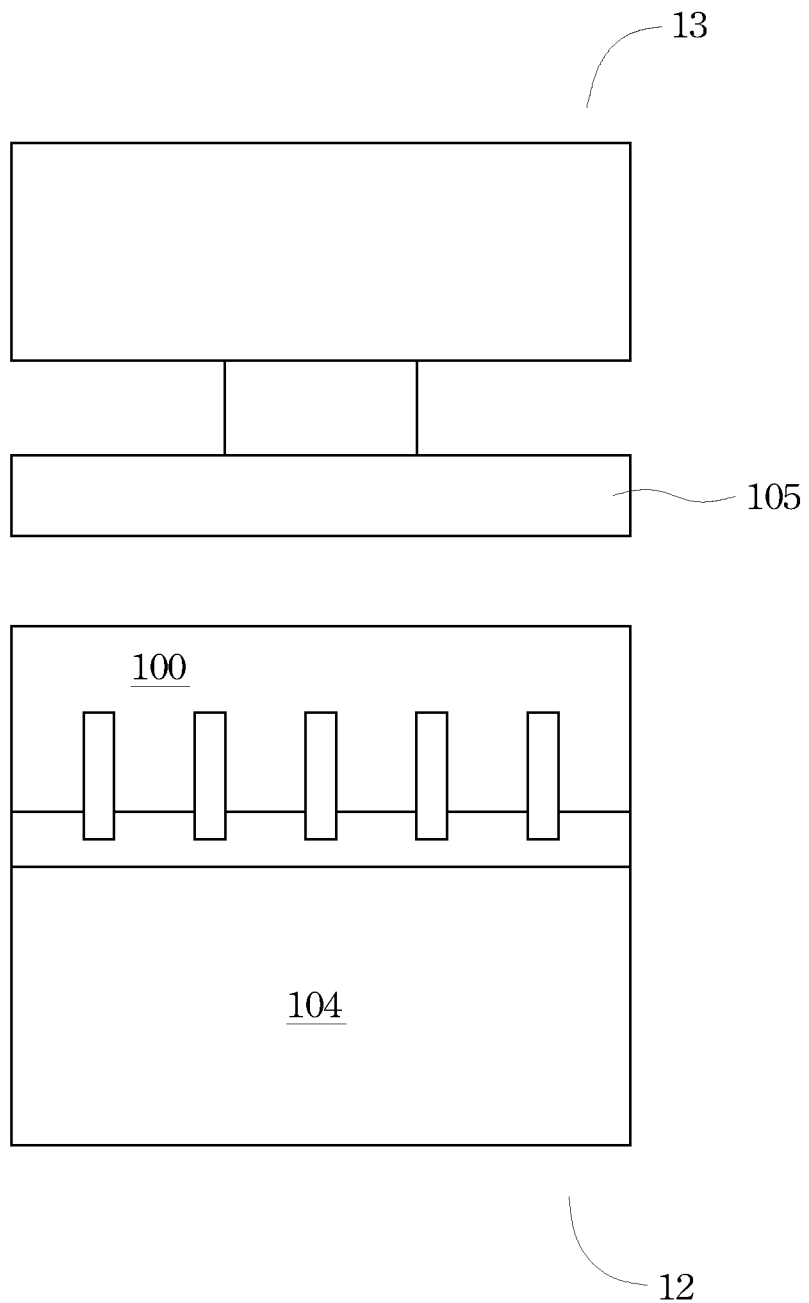
Figure 1C:
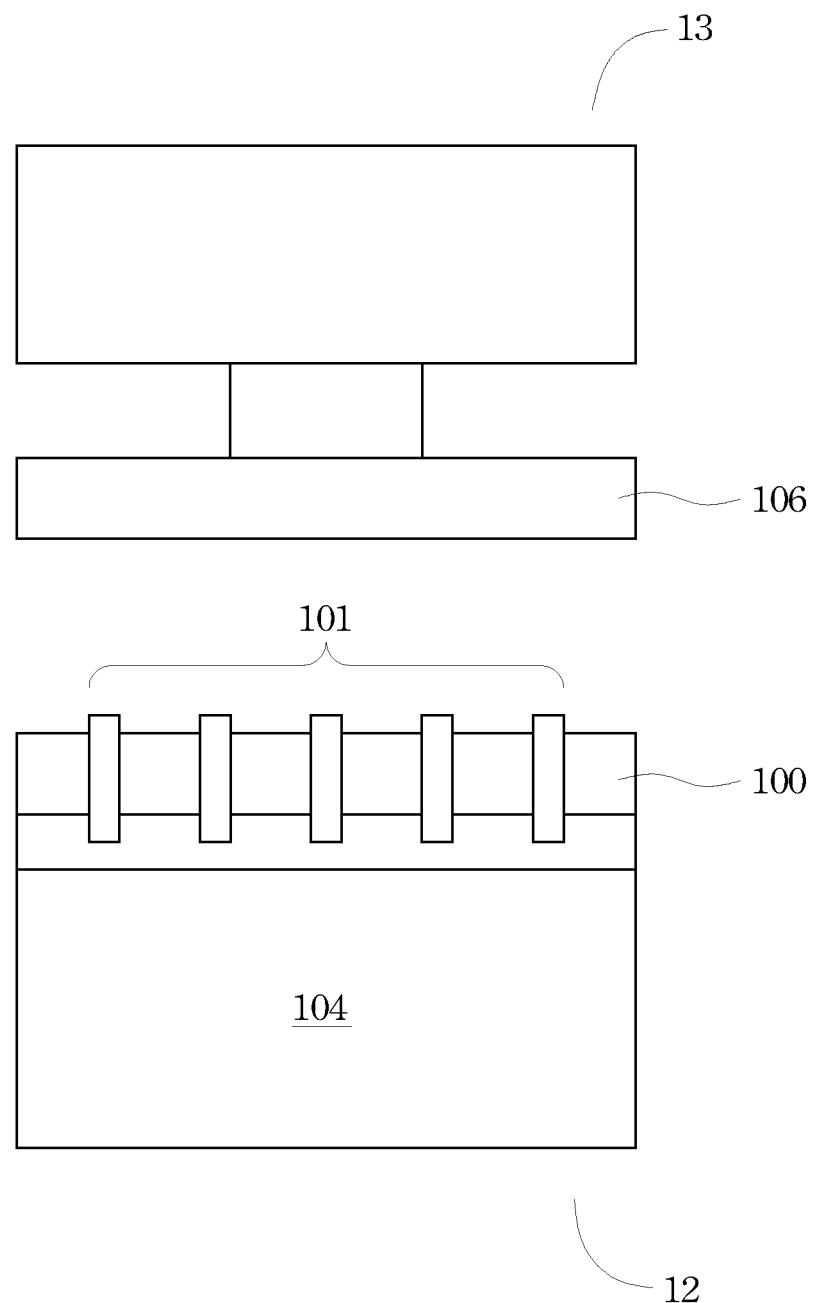
Figure 2A:
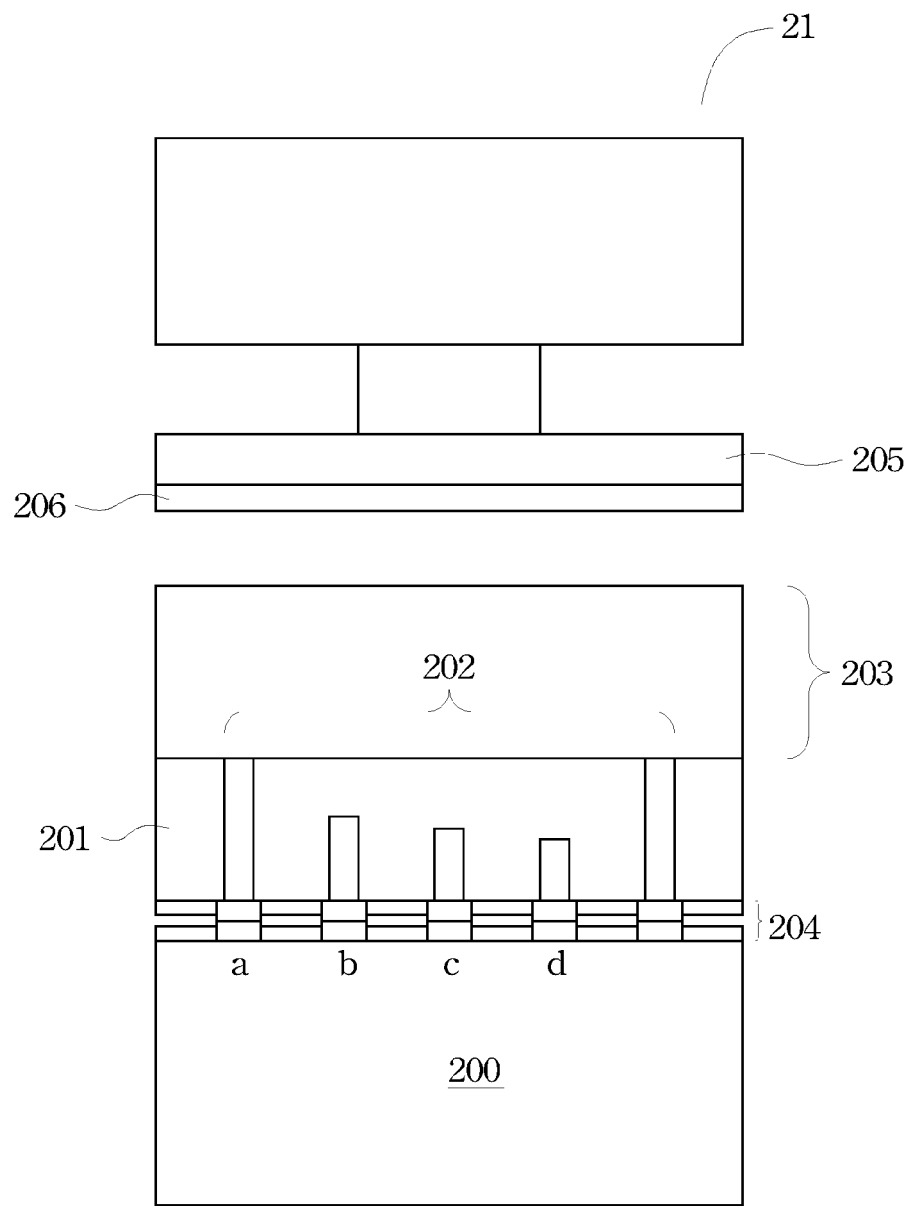
FIGS. 2A-2B are cross-sectional views of a stacked wafer during a wafer thinning process configured according to a representative embodiment.

With reference to FIG. 2A, there is shown a cross-sectional view of stacked wafer 20 during a thinning process configured according to one embodiment. Stacked wafer 20 comprises two semiconductor dies connected at bonding layer 204 and having front-side substrate 200 and backside substrate 201. The grinding process begins with processing system 21 applying grinding surface 206 to the backside of stacked wafer 20. Processing system 21 may comprise any number of various mechanical grinding and/or polishing systems. Processing system 21 removes substrate amount 203 from the backside in order to leave a desired maximum grinding thickness. The backside die also comprises TSV 202 which has been formed into a pattern having varying, known specific depths. As grinding surface 206 gets close to TSV 202a, current sensor 205 detects an increase in current passing through the wheel or platen motor of processing system 21 or eddy currents that may arise during the grinding. This increase in current indicates to processing system 21 that TSV 202a is getting close. TSV 202a is known to be formed at a specific depth which represents a specific remaining thickness of substrate 201.

Eddy current is an electrical phenomenon caused when a moving (or changing) magnetic field intersects a conductor, or vice-versa. The relative motion causes a circulating flow of electrons, or current, within the conductor. These circulating eddies of current create electromagnetic moments with magnetic fields that generally oppose the effect of the applied magnetic field. The stronger the applied magnetic field, or greater the electrical conductivity of the conductor, or greater the relative velocity of motion, the greater the currents developed and the greater the opposing field.

In the example embodiment depicted in FIG. 2A, the thickness represented by TSV 202a corresponds to the thickness at which point the grinding process is to stop. Thus, when processing system 21 detects the corresponding increased current through current sensor 205, grinding stops at an appropriate depth.

Figure 2B:
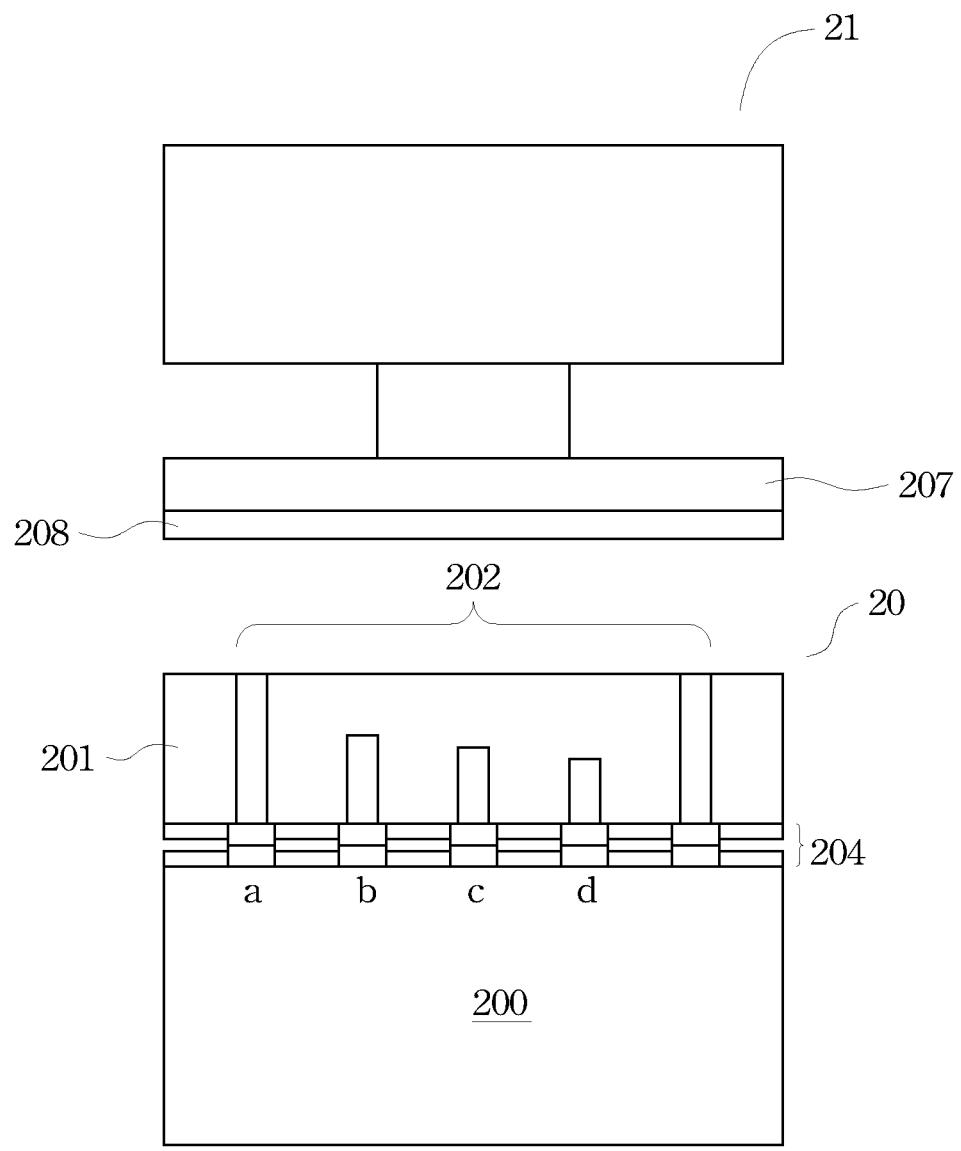

FIG. 2B is a cross-sectional view of stacked wafer 21 during a wafer thinning process configured according to one embodiment. After coarse grinding by grinding surface 206 is complete, processing system 21 applies fine polishing surface 208 to continue removing desired portions of backside substrate 201. Processing system 21 also includes current detector 207 associated with fine polishing surface 208 in order to detect wheel or platen motor current and/or eddy current that is encountered during the polishing of stacked wafer 20. As processing system 21 removes more of backside substrate 201, fine polishing surface 208 will come into contact with more of TSV 202. In response to this contact, the wheel or platen motor current or eddy currents begin to rise. Current sensor 207 will sense this increase and signal to processing system 21 when to stop polishing to reach the desired thickness.

Because the TSVs are formed at varying, known depths, they may also be used as a thickness indicator not only during the wafer thinning process but in the after thinning inspection (ATI) as well. For example, a desired thickness may leave enough backside substrate to keep particular TSVs unexposed. The actual thickness may then be indicated through techniques such as pattern recognition, optical microscopes, scanning electron microscopes, or the like. When some TSVs are exposed and others remain covered by the substrate, a pattern forms on the backside surface. (e.g., see FIG. 4). Additionally, a cross-sectional inspection of a given device may reveal the relationship between the top surface of the backside substrate and the closest TSV. As the TSVs are at known depths, the thickness of the backside substrate will be easier to estimate.

It should be noted that the TSVs formed for implementing various embodiments may be formed within any given wafer substrate using any known process of TSV formation. In representative embodiments, TSVs may be formed to have a high depth-to-width ratio. For example, Bosch etching employs a deep reactive ion etching that uses two different gas types in a reactor, which can achieve etching ratios of up to around 50:1.

By providing TSVs in the systematic arrangement of known depths, various embodiments not only allow for determining endpoints during the thinning process, but also provide assistance in ATI. ATI is a process in which a thinned wafer may be inspected to determine its thickness, as well as any damage that may have occurred by the thinning process.

Figure 3A:
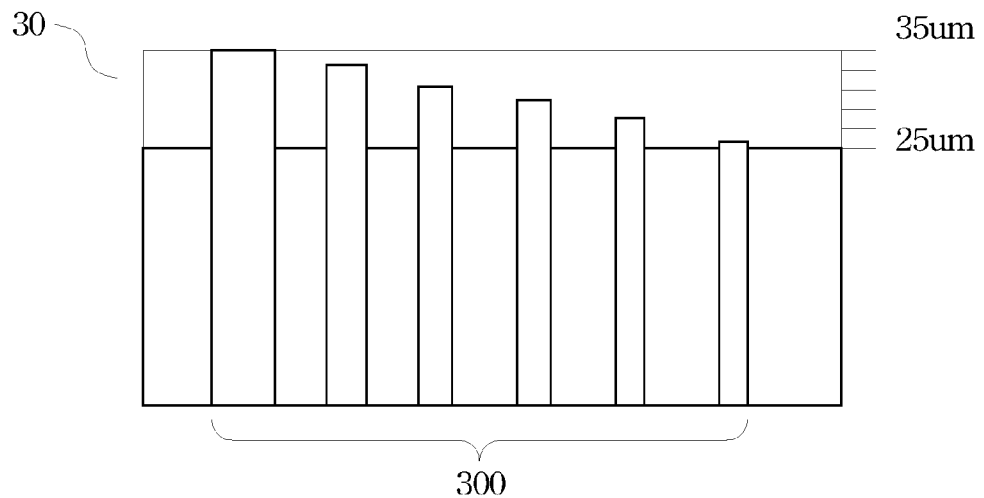
FIGS. 3A-3B are cross-sectional views of a wafer having a thickness indicator configured according to a representative embodiment.

FIG. 3A is a cross-sectional view of wafer 30 having thickness indicator 300 configured according to one embodiment. Thickness indicator 300 comprises a group of TSVs formed at different specific gradient depths within wafer 30. A distance of 10 µm is representatively illustrated (35 µm-25 µm). With six TSVs making up thickness indicator 300, there is an approximate graded difference of 2 µm between the deepest TSV and shallowest TSV. Therefore, depending on which TSVs are exposed in thickness indicator 300, the thickness of the backside substrate of wafer 30 may be determined.

Figure 3B:
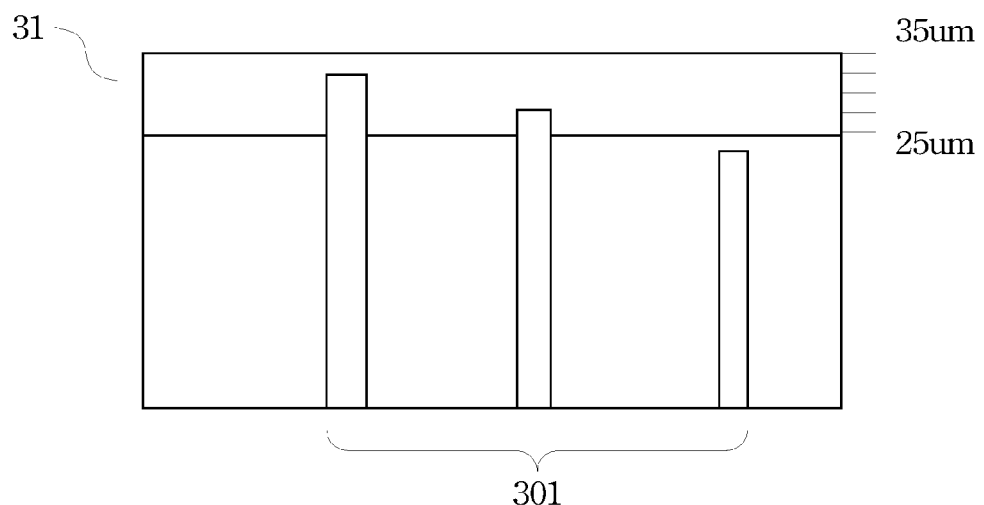

FIG. 3B is a cross-sectional view of wafer 31 having thickness indicator 301 configured according to one embodiment. The embodiment represented with thickness indicator 301 illustrates that various measurement points may be provided. In wafer 31, thickness indicator 301 comprises three TSVs also spanning a gradient depth of 10 µm. Therefore, an approximate difference of 5 µm exists between the deepest TSV and shallowest TSV of thickness indicator 301.

Figure 4A:
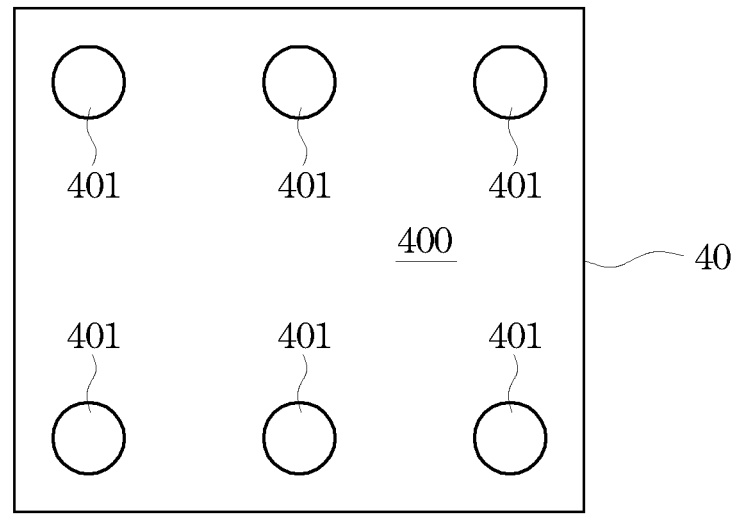
FIGS. 4A-4D are planar top views of successive patterns formed on a surface of a stacked wafer during a wafer thinning process configured according to a representative embodiment.

FIGS. 4A-4D are planar top views of successive patterns formed on a surface of stacked wafer 40 during a wafer thinning process configured according to one embodiment. In FIG. 4A, the grinding portion of the wafer thinning process has removed backside substrate 400 to reach TSV 401. The wafer thinning system according to one embodiment has formed multiple TSVs within the top die of stacked wafer 40. The representatively illustrated example includes four sets of graded-depth TSVs. Multiple TSVs may be formed at known, graded depths. For purposes of the example embodiment representatively illustrated in FIGS. 4A-4D, the TSVs extend from a backside substrate thickness of from 35 µm to 20 µm. TSV 401 correspond to the deepest TSVs in the wafer thinning system of stacked wafer 40, in which the thickness of the backside substrate with the pattern formed in FIG. 4A is approximately 35 µm.

Figure 4B:
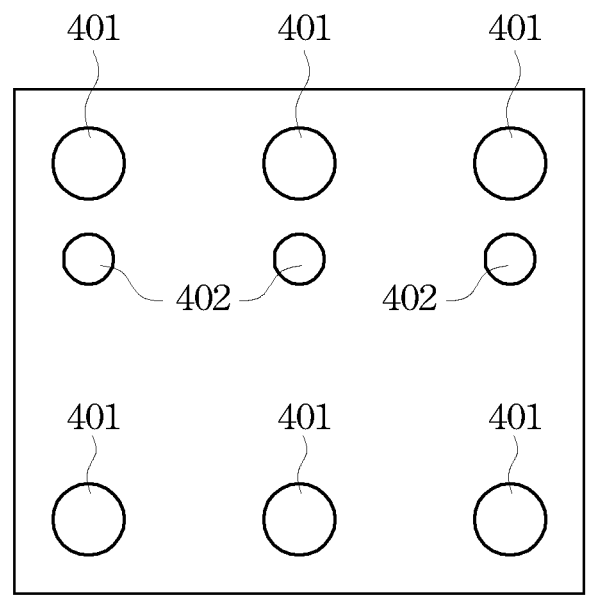
Figure 4C:
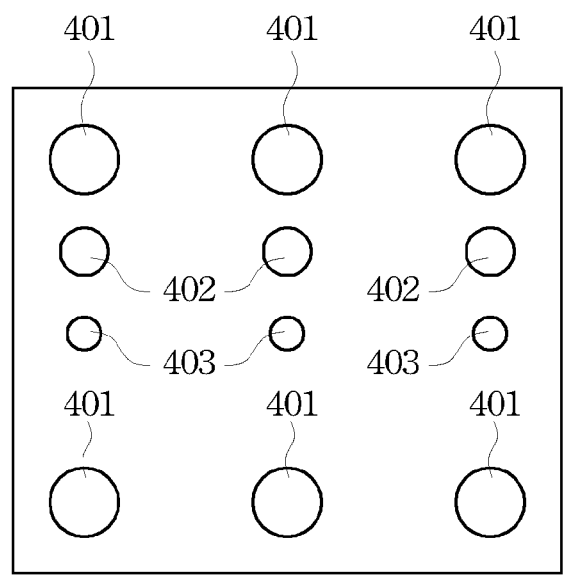
Figure 4D:
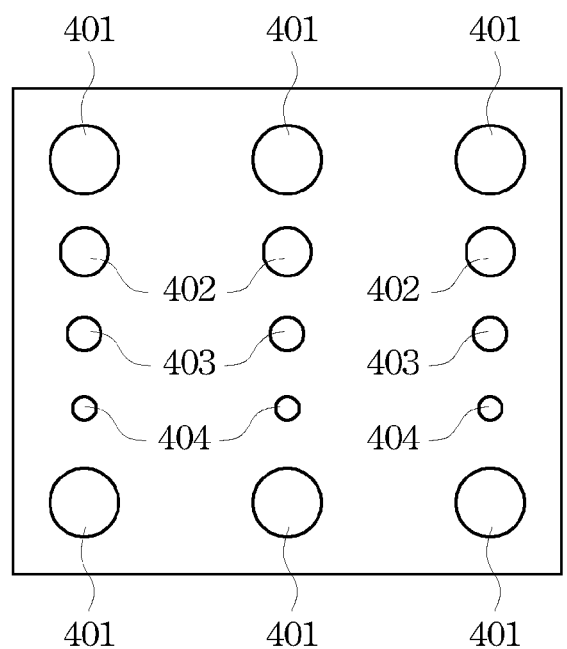

At 35 µm, the wafer thinning processes switches from coarse grinding over to a finer polishing. In FIG. 4B, a new pattern has been formed as backside substrate 400 is further removed during polishing. The pattern comprises TSV 401 and TSV 402. A pattern recognition sensor (not shown) views a scanned image of the substrate surface to detect the pattern of TSVs 401 and 402 and recognize that the thickness of backside substrate 400 is now at 30 µm. Because four sets of TSVs make up the illustrated wafer thinning system, the difference in depth between each successive set of TSV is approximately 5 µm.

The wafer thinning process continues with polishing to repair and remove further semiconductor material, reducing the thickness of backside substrate 400 to 25 µm. This depth may be recognized by a pattern recognition sensor (not shown) as comprising TSVs 401-403, as representatively shown in FIG. 4C. When this pattern is present, the thickness of wafer 40 may be known to be between approximately 25 µm and 21 µm. As the wafer thinning process continues, the pattern produced by TSVs 401-404, as representatively shown in FIG. 4D, indicates that the thickness of backside substrate 400 has reached at least 20 µm. This pattern represents the lowest desired thickness of wafer 40. Accordingly, the wafer thinning process would stop as the pattern of TSVs 401-404 is detected by the pattern detector.

It should be noted that various additional and/or alternative embodiments may use processes other than a pattern detector in order to detect the progress of wafer thinning. Optical methods, such as laser and IR systems may be used to determine the endpoint of polishing by examination of TSVs. Additionally, current detection may also be used to monitor the thickness of the backside substrate during thinning. Current sensors, which may be shared by both grinding and polishing elements or individually associated therewith, may then be used to measure changes in current in the wheel or platen motor of the wafer thinning machine and/or changes caused by eddy current.

Figure 4E:
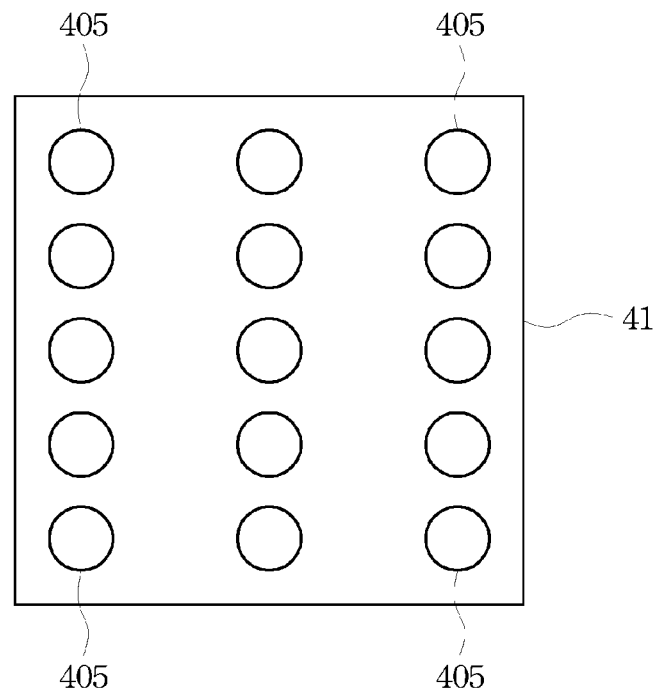
FIG. 4E is planar top view of a pattern formed on a surface of a stacked wafer during a wafer thinning process configured according to a representative embodiment.

It should be noted that, although FIGS. 4A-4D are shown with TSVs 401-404 having varied widths or diameters, alternative and/or additional embodiments may be fabricated using TSVs of the same width or diameter. An example of such an embodiment is shown in FIG. 4E. Instead of forming the patterns with different size TSVs, wafer 41 has been fabricated with TSVs 405, each having the same diameter.

Figure 5:
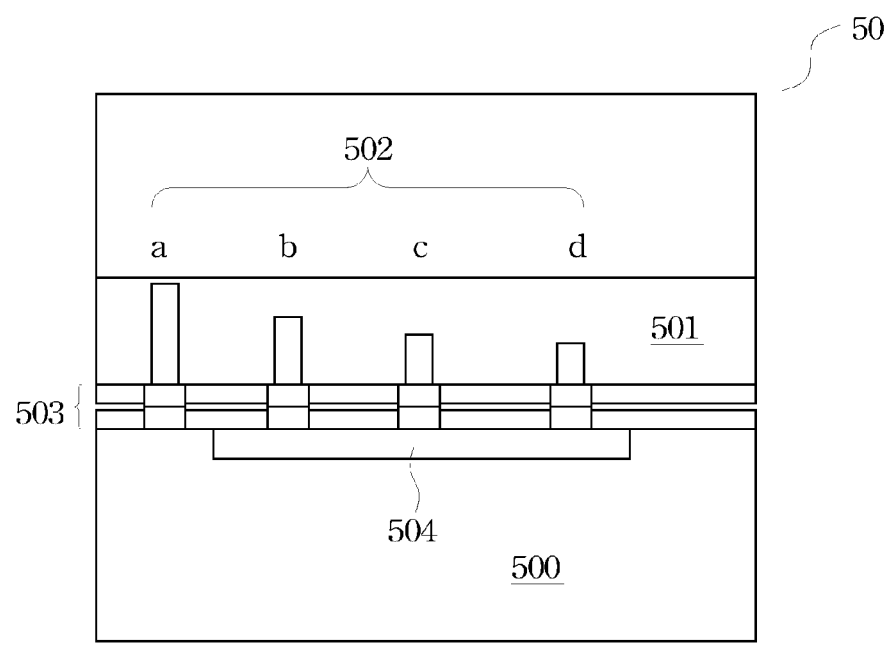
FIG. 5 is a cross-sectional view of a stacked IC having a wafer thinning system configured according to a representative embodiment.

FIG. 5 is a cross-sectional view of stacked IC 50 having a wafer thinning system configured according to one embodiment. Stacked IC 50 comprises two wafer dies joined at bonding region 503. The front-side wafer die comprises substrate 500 and active region 504, among other things. The backside wafer die includes substrate 501 and TSV 502. TSV 502 is formed at multiple, known depths that become progressively shallower from TSV 502a to TSV 502d (e.g., graded). Additionally, TSV 502b-d is connected to active region 504 while TSV 502a is not. This selective connection between TSV 502 and active device region 504 allows a more complete thickness indicator to be fabricated without a limitation based on the number of TSVs to be formed for connecting active region 504. Thus, while TSV 502a is useful to designate the thickness where grinding should be replaced by polishing, it does not have to be connected into active region 504.

Figure 6:
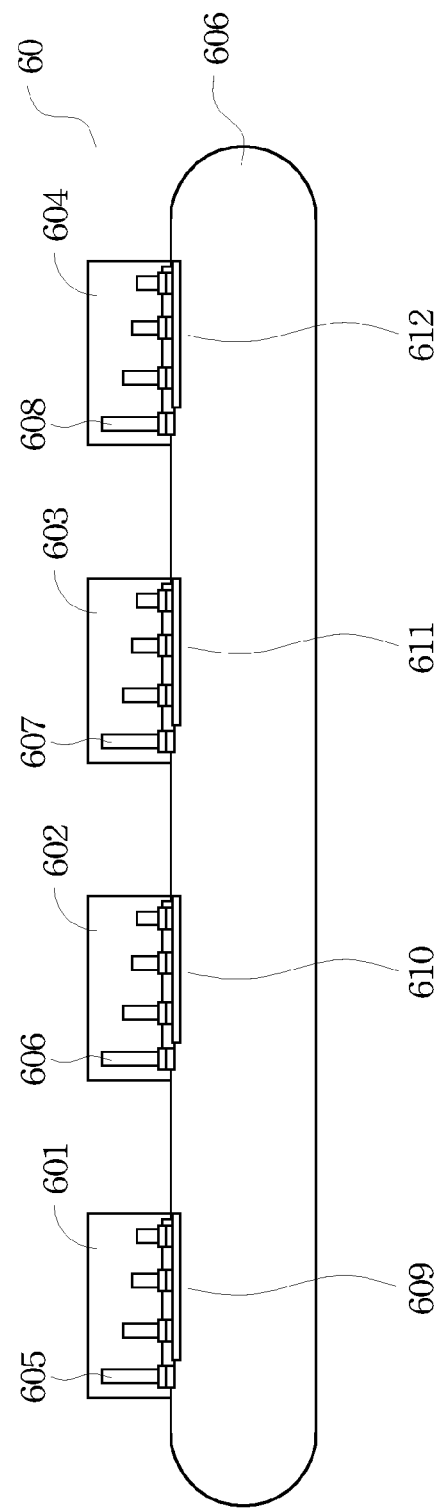
FIG. 6 is a cross-sectional view of a C2W stacked wafer incorporating a wafer thinning system configured according to a representative embodiment.

It should be noted that various embodiments may be used in any semiconductor device fabrication process, such as wafer-to-wafer (W2W), chip-to-wafer (C2W), chip-to-chip (C2C), and the like. FIG. 6 is a cross-sectional view of C2W stacked wafer 60 incorporating a wafer thinning system configured according to one embodiment. Wafer 600 may be processed to include active device regions 609-612. Individual IC chips 601-604 have been separately fabricated, tested, and separated. IC chips 601-604 include thickness indicator TSV 605-608, respectively. These separate IC chips 601-604 are then bonded to wafer 600 at locations corresponding to active device regions 609-612. When C2W stacked wafer 60 enters a wafer thinning process, grinding and polishing occur on the backside substrate of IC chips 601-604. A detection method detects when each individual TSV in thickness indicator TSVs 605-608 are exposed. Once the backend substrate for each of IC chips 601-604 has been thinned to a desired level, the stacked die may be separated from C2W stacked wafer 60 for use.

It should be noted that any detection methods described in various methods above may be used to detect the exposure of an individual TSV in thickness indicator TSV 605-608. Such detection methods include current monitoring (such as wheel or platen motor current and eddy current), optical pattern recognition, laser and IR measurement systems, optical microscopes (OM), scanning electron microscopes (SEM), and/or the like.

Figure 7:
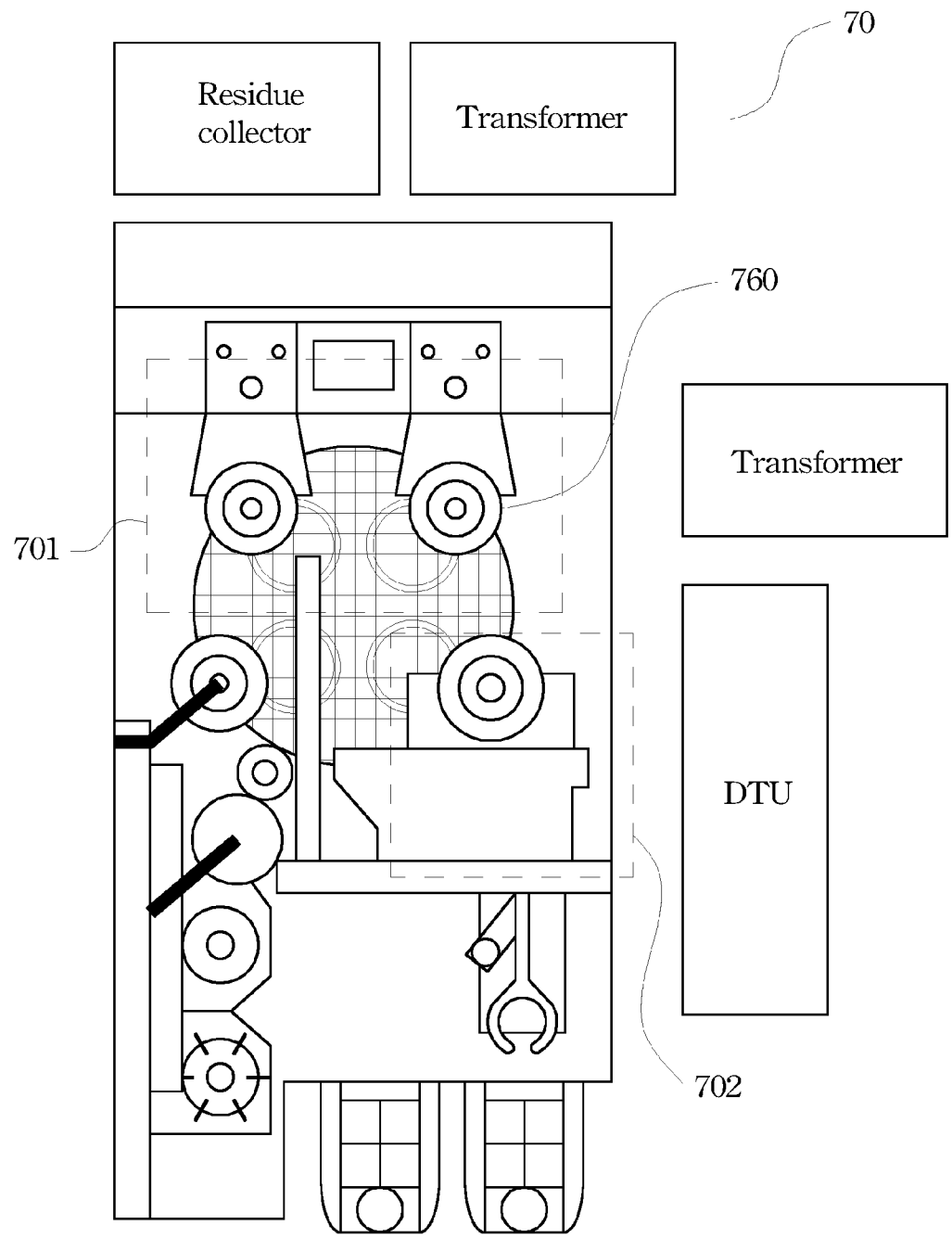
FIG. 7 is a diagram illustrating a wafer processing system configured according to a representative embodiment.

FIG. 7 is a diagram representatively illustrating processing system 70 configured according to one embodiment. Processing system 70 positions wafer 700 under processing areas of processing system 70 using a wheel or platen. The first area, grinding region 701 includes replaceable grinding pads on grinding elements that have current sensors formed therein. The grinding from grinding region 701 continues until a current change is detected when the first set of device structures are reached. Device structures can be structures such as TSVs, trenches, alignment marks, and/or the like. Wafer 700 is then rotated on the platen or wheel such that the region that was previously under grinding region 701 is positioned under CMP region 702. CMP region 702 has polishing elements that have replaceable polishing surfaces thereon. CMP may be performed on the substrate damaged by the grinding to repair and continue to remove the material from the backside of wafer 700 to reach a desired thickness. Detection features, such as those that have been disclosed herein, including additional current sensors within the polishing elements, may be incorporated into CMP region 702 to detect when a desired thickness is reached.

It should be noted that the wafer thinning tool illustrated in FIG. 7 may be only one example of a wafer thinning tool that can be configured according to various embodiments. Illustration of processing system 70 is not intended to limit implementation of representatively disclosed embodiments in any way.

Figure 8:
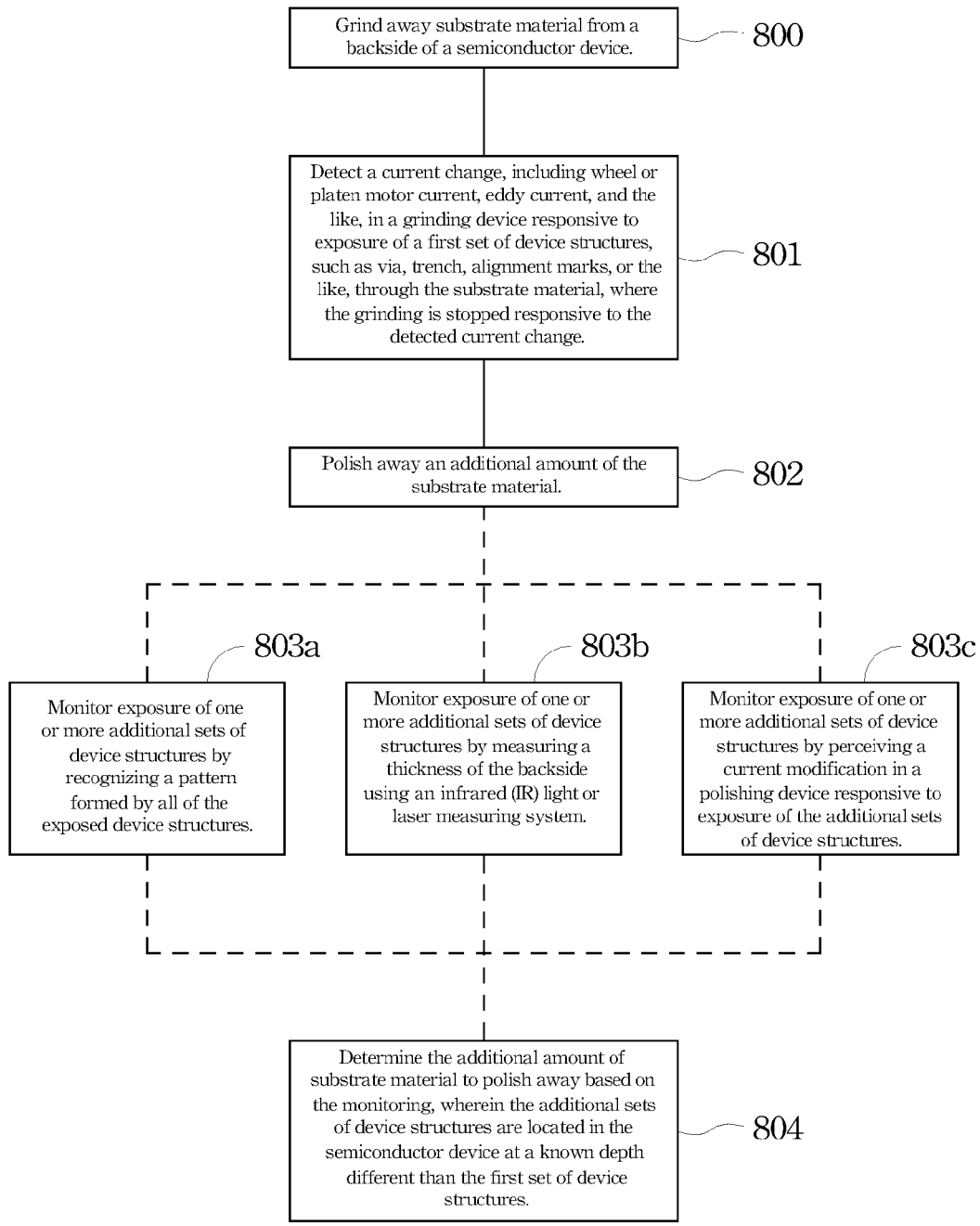
FIG. 8 is a flowchart illustrating example steps executed to implement a representative embodiment.

FIG. 8 is a flowchart illustrating example steps executed to implement one embodiment. In step 800, substrate material is ground away from a backside of a semiconductor device. A current change, including wheel or platen motor current, eddy current, and/or the like, is detected, in step 801, within a grinding device responsive to exposure of a first set of device structures, such as via, trench, alignment marks, and/or the like, through the substrate material, where the grinding is stopped responsive to detected current change. In step 802, an additional amount of the substrate material is polished away. Exposure of additional sets of device structures may be monitored by alternative means. Selected alternative methods are presented here. In alternative step 803a, exposure of one or more additional sets of device structures is monitored by recognizing a pattern formed by all of the exposed device structures. Alternatively, in step 803b, exposure of one or more additional sets of device structures is monitored by measuring a thickness of the backside using an infrared (IR) light or laser measuring system. Alternatively, in step 803c, exposure of one or more additional sets of device structures is monitored by perceiving a current modification in a polishing device responsive to exposure of the additional sets of device structures. In step 804, the additional amount of substrate material to polish away may be determined based on the monitoring, where the additional sets of device structures are located in the semiconductor device at a known depth different than the first set of device structures.

Figure 9:
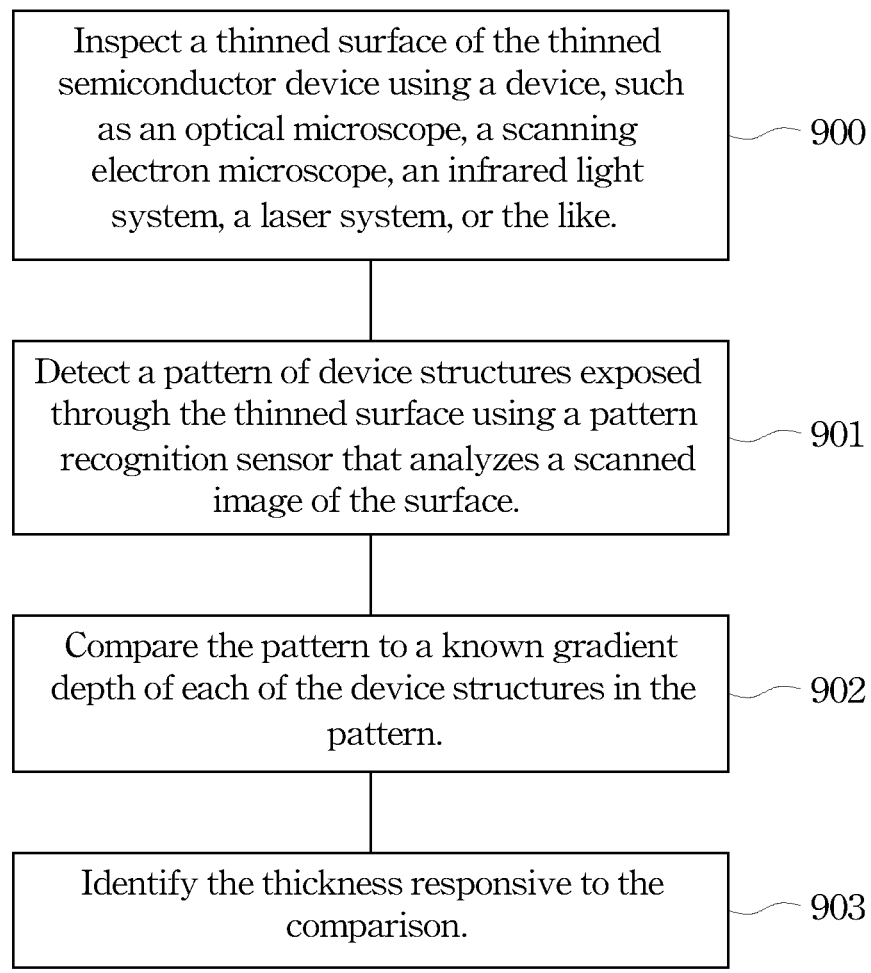
FIG. 9 is a flowchart illustrating example steps executed to implement a representative embodiment.

FIG. 9 is a flowchart illustrating example steps executed to implement one embodiment. In step 900, a thinned surface of the thinned semiconductor device is inspected using a device, such as an optical microscope, a scanning electron microscope, an infrared light system, a laser system, and/or the like. A pattern of device structures exposed through the thinned surface is detected, in step 901, using a pattern recognition sensor that analyzes a scanned image of the surface. The pattern is compared to a known gradient depth of each of the device structures in the pattern in step 902. In step 903, the thickness is identified responsive to the comparison.

Figure 10:
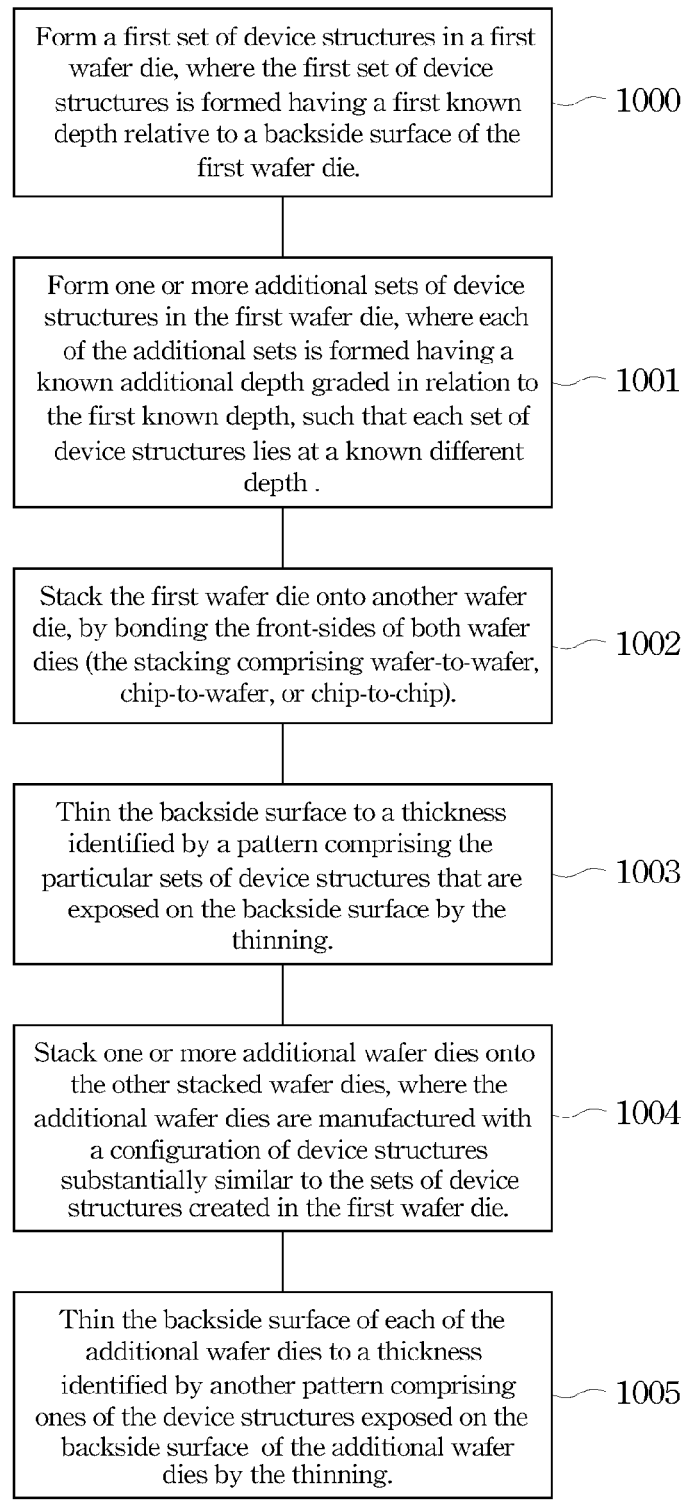
FIG. 10 is a flowchart illustrating example steps executed to implement a representative embodiment.

FIG. 10 is a flowchart illustrating example steps executed to implement one embodiment. In step 1000, a first set of device structures is formed in a first wafer die having a first known depth relative to a backside surface of the first wafer die. In step 1001, one or more additional sets of device structures are formed in the first wafer die, where each of the additional sets is formed having a known additional depth graded in relation to the first known depth, such that each set of device structures lies at a known different depth. The first wafer die is stacked onto another wafer die, in step 1002, by bonding the front-sides of both wafer dies (the stacking comprising wafer-to-wafer, chip-to-wafer, or chip-to-chip). The backside surface is thinned, in step 1003, to a thickness identified by a pattern comprising the particular sets of device structures that are exposed on the backside surface by the thinning. One or more additional wafer dies may be stacked onto the other stacked wafer dies, in step 1004, where the additional wafer dies are manufactured with a configuration of device structures substantially similar to the sets of device structures produced in the first wafer die. The backside surface of each of the additional wafer dies is then thinned, in step 1005, to a thickness identified by another pattern comprising ones of the device structures exposed on the backside surface of the additional wafer dies by the thinning.

These and other problems are generally solved, circumvented, or otherwise at least partially ameliorated, and technical advantages may be generally achieved, by representative embodiments which provide means for controlling grinding/polishing processes directly in a wafer being thinned. The wafer die may be manufactured to include multiple sets of device structures, such as via, trenches, alignment marks, and/or the like. Each set of these structures may be formed at a specific, known depth relative to the backside surface. Moreover, each set may be at a different, known depth, such that a gradient depth exists across multiple sets.

As grinding begins, sensors in the grinding elements detect changes or fluctuations in current passing through the grinding machine. These current changes or fluctuations come from the grinding surfaces coming into contact with the various ones of the device structures. The current sensor may then signal the grinding machine to stop when the current changes by a specific amount corresponding to the grinding surface hitting a specific set of device structures.

Once the grinding process stops, polishing may begin to repair the surface and further remove substrate material from the backside surface. Additional monitoring of the backside surface continues during polishing to determine a pattern of device structures that are successively exposed during the polishing part of the thinning process. Exposed device structures may, therefore, also control the polishing process as well.

After thinning, the configuration of the pattern formed by the exposed device structures may also be used to inspect and determine the final thickness of the substrate. Because each of the device structures may be placed at a known depth, this information may be used to determine the final thickness.

FIGS. 11-14 illustrate various intermediate steps of forming an interconnect structure between two bonded wafers or dies in accordance with some embodiments. Embodiments such as those discussed above form through vias (TVs) in a first substrate prior to bonding, and thereafter thins the first substrate to expose the through vias. Embodiments such as those disclosed below with reference to FIGS. 11-14 bond a first substrate and a second substrate, and thereafter form through vias from a backside of the substrate. As discussed in greater detail below, a width of the through vias will be modified dependent upon, e.g., a depth of the via, thereby providing a structure having different widths of through vias.

Figure 11:
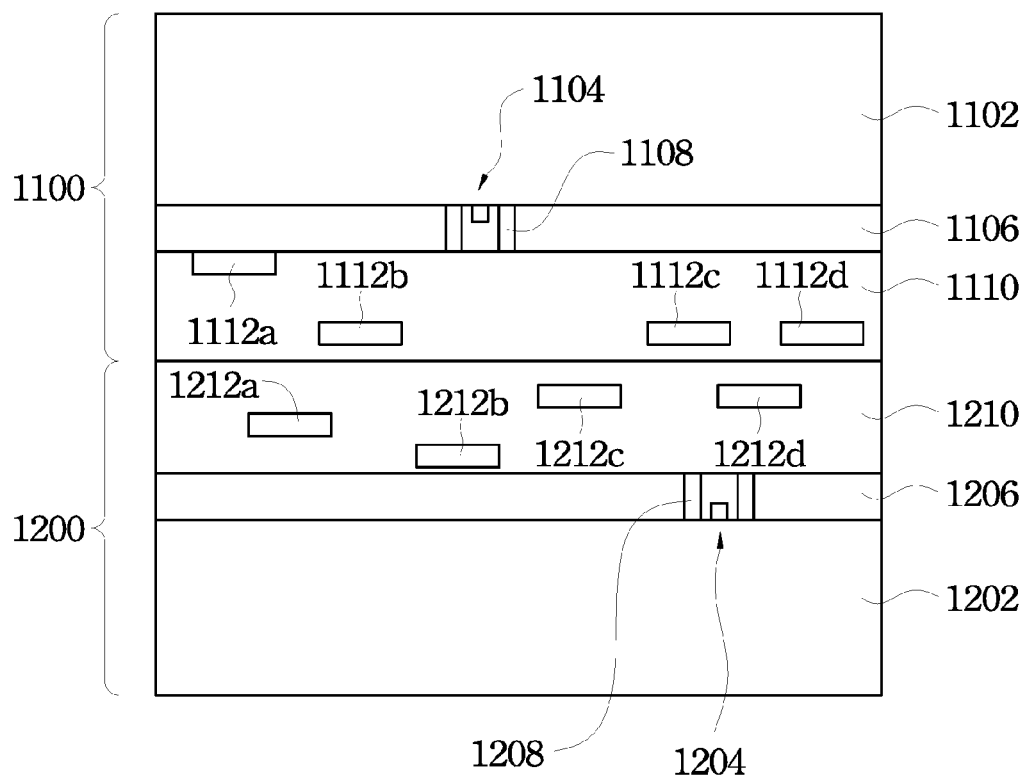
FIGS. 11-14 are various cross-sectional views illustrating formation of a device in accordance with some embodiments.

As representatively illustrated in FIG. 11, a first wafer 1100 may be bonded to a second wafer 1200. In an embodiment, the second wafer 1200 has similar features as the first wafer 1100, and for the purpose of the following discussion, features of the second wafer 1200 having reference numerals of the form "12xx" are similar to features of the first wafer 1100 having reference numerals of the form "11xx;" the "xx" being the same numerals for the first wafer 1100 and the second wafer 1200. Various elements of the first wafer 1100 and the second wafer 1200 will be referred to as the "first <element>11xx" and the "second <element>12xx," respectively.

In an embodiment, the first wafer 1100 comprises a first substrate 1102 having a first electrical circuit (illustrated collectively by first electrical circuitry 1104) formed thereon. The first substrate 1102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer may be provided on a substrate, typically a silicon or glass substrate. Other substrates, such as a multi-layered or gradient substrate may also be used.

First electrical circuitry 1104 formed on first substrate 1102 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, first electrical circuitry 1104 may include various N-type metal-oxide semiconductor (NMOS) and/or P-type metal-oxide semiconductor (PMOS) devices, such as transistors, capacitors, resistors, diodes, photo-diodes, fuses, and/or the like, interconnected to perform one or more functions. The functions may include memory structures, processing structures, sensors, amplifiers, power distribution, input/output circuitry, image sensors, and/or the like. One of ordinary skill in the art will appreciate that the above examples are provided for illustrative purposes only to further explain applications of representative embodiments and are not meant to limit the disclosure in any manner. Other circuitry may be used as appropriate for a given application.

Also shown in FIG. 11 is a first inter-layer dielectric (ILD)/inter-metallization dielectric (IMD) layer 1106. The first ILD layer 1106 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, and/or the like, by any suitable method known or otherwise hereafter described in the art, such as spinning, chemical vapor deposition (CVD), and plasma-enhanced CVD (PECVD). It should also be noted that the first ILD layer 1106 may comprise a plurality of dielectric layers. Second ILD layer 1206 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, and/or the like, by any suitable method known or otherwise hereafter described in the art, such as spinning, chemical vapor deposition (CVD), and plasma-enhanced CVD (PECVD). It should also be noted that second ILD layer 1206 may comprise a plurality of dielectric layers.

First contacts 1108 may be formed through first ILD layer 1106 to provide an electrical contact to first electrical circuitry 1104. First contacts 1108 may be formed, for example, by using photolithography techniques to deposit and pattern a photoresist material on first ILD layer 1106 to expose portions of first ILD layer 1106 that are to become first contacts 1108. An etch process, such as an anisotropic dry etch process, may be used to form openings in first ILD layer 1106. The openings may be lined with a diffusion barrier layer and/or an adhesion layer (not shown), and filled with a conductive material. The diffusion barrier layer may comprise one or more layers of TaN, Ta, TiN, Ti, CoW, and/or the like, and the conductive material may comprise copper, tungsten, aluminum, silver, and combinations thereof, and/or the like, thereby forming first contacts 1108 as illustrated in FIG. 11.

Second contacts 1208 may be formed through second ILD layer 1206 to provide an electrical contact to second electrical circuitry 1204. Second contacts 1208 may be formed, for example, by using photolithography techniques to deposit and pattern a photoresist material on second ILD layer 1206 to expose portions of second ILD layer 1206 that are to become second contacts 1208. An etch process, such as an anisotropic dry etch process, may be used to form openings in second ILD layer 1206. The openings may be lined with a diffusion barrier layer and/or an adhesion layer (not shown), and filled with a conductive material. The diffusion barrier layer may comprise one or more layers of TaN, Ta, TiN, Ti, CoW, and/or the like, and the conductive material may comprise copper, tungsten, aluminum, silver, and combinations thereof, and/or the like, thereby forming second contacts 1208 as illustrated in FIG. 11.

One or more intermetallization (IMD) layers 1110 and first interconnect lines 1112a-1112d (collectively referred to as first interconnect lines 1112) form metallization layers over first ILD layer 1106. Generally, the one or more IMD layers 1110 and the associated metallization layers may be used to interconnect the electrical circuitry to each other as discussed above and to provide an external electrical connection. IMD layers 1110 may be formed of a low-K dielectric material, such as fluorosilicate glass (FSG) using PECVD techniques or high-density plasma chemical vapor deposition (HDPCVD), and/or the like, and may include intermediate etch stop layers. External contacts (not shown) may be formed in an uppermost layer.

It should also be noted that one or more etch stop layers (not shown) may be positioned between adjacent ones of the ILD layers, e.g., first ILD layer 1106, and IMD layers 1110. Generally, the etch stop layers provide a mechanism to stop an etching process when forming vias and/or contacts. The etch stop layers may be formed of a dielectric material having a different etch selectivity from adjacent layers, e.g., underlying first substrate 1102 and overlying dielectric layers (e.g., ILD layer 1106 and IMD layers 1110). In an embodiment, etch stop layers may be formed of SiN, SiCN, SiCO, CN, combinations thereof, and/or the like, deposited by CVD or PECVD techniques.

In some embodiments, first wafer 1100 comprises a backside illumination sensor (BIS) and second wafer 1200 comprises a logic circuit, such as an application-specific integrated circuit (ASIC) device. In such an embodiment, electrical circuitry 1104 may include photo active regions, such as photo-diodes formed by implanting impurity ions into the epitaxial layer. Furthermore, the photo active regions may be a PN junction photo-diode, a PNP photo-transistor, an NPN photo-transistor, and/or the like. The BIS sensor may be formed in an epitaxial layer over a silicon substrate.

Second wafer 1200 may comprise a logic circuit, an analog-to-digital converter, a data processing circuit, a memory circuit, a bias circuit, a reference circuit, and/or the like.

In some embodiments, first wafer 1100 and second wafer 1200 may be arranged with device sides of first substrate 1102 and second substrate 1202 facing each other, as representatively illustrated in FIG. 11. As discussed in greater detail below, openings may be formed extending from a backside (opposite the device side) of first wafer 1100 to the selected portions of first interconnect lines 1112 and/or second interconnect lines 1212. The openings may be subsequently filled with a conductive material, thereby forming an electrical contact on the backside of the first wafer to respective interconnect lines of first wafer 1100 and second wafer 1200. Widths of the openings can be adjusted to compensate for the desired depth.

First wafer 1100 and second wafer 1200 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof, and/or the like.

It should be noted that the bonding may be at wafer level, wherein first wafer 1100 and second wafer 1200 are bonded together, and are then singulated into separated dies. Alternatively, the bonding may be performed at the die-to-die level, or the die-to-wafer level.

Figure 12:
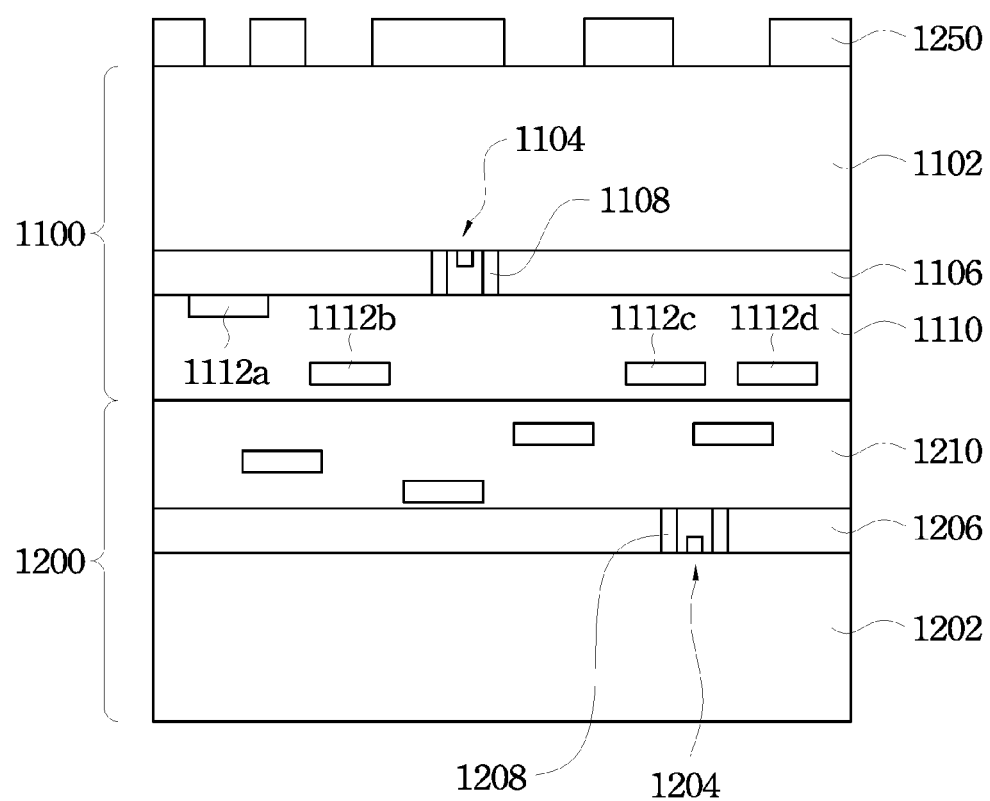

Referring now to FIG. 12, a thinning process is performed and a mask layer 1250 patterned to have openings 1252A-D (collectively referred to as openings 1252) formed along a backside of first substrate 1102 in accordance with some embodiments. After first wafer 1100 and second wafer 1200 are bonded, a thinning process may be applied to the backside of first substrate 1102. In an embodiment in which first substrate 1102 comprises a BIS sensor, the thinning process serves to allow more light to pass through from the backside of the first substrate to the photo-active regions without being absorbed by the substrate. In an embodiment in which the BIS sensor is fabricated in an epitaxial layer, the backside of first substrate 1102 may be thinned until the epitaxial layer is exposed. The thinning process may be implemented by using suitable techniques such as grinding, polishing, a SMARTCUT® procedure, an ELTRAN® procedure, and/or chemical etching.

Also shown in FIG. 12 is mask layer 1250 patterned to have openings 1252. As discussed in greater detail below, electrical connections may be formed extending from a backside of first wafer 1100 to select ones of first interconnect lines 1112 and/or second interconnect lines 1212 of second wafer 1200, in accordance with the pattern of the openings 1252. For example, first opening 112a may be patterned to form an electrical connection to first interconnect line 1112a, first opening 1112b may be patterned to form an electrical connection to first interconnect line 1112b, first opening 1112c may be patterned to form an electrical connection to second interconnect line 1212c, and first opening 112d may be patterned to form an electrical connection to first interconnect lines 1112c-1112d and second interconnect line 2112d.

In some embodiments, mask layer 1250 may include, for example, a photosensitive material and may be patterned to form first openings 1250 using, for example, photolithography techniques. Generally, photolithography techniques involve depositing a photoresist material, which is subsequently irradiated (exposed) and developed to remove a portion of the photoresist material. The remaining photoresist material protects the underlying material from subsequent processing steps, such as etching.

Other layers may be used in the patterning process. For example, one or more optional hard mask layers may be used. Generally, one or more hard mask layers may be useful in embodiments in which the etching process requires masking in addition to the masking provided by the photoresist material. During the subsequent etching process to pattern first substrate 1102, the patterned photoresist mask will also be etched, although the etch rate of the photoresist material may not be as high as the etch rate of first substrate 1102. If the etch process is such that the patterned photoresist mask would be consumed before the etching process is completed, then an additional hard mask may be utilized. The material of the hard mask layer or layers may be selected such that the hard mask layer(s) exhibit a lower etch rate than the underlying materials, such as the materials of first substrate 1102.

Additionally, an optional anti-reflection coating (ARC) layer may be used. The ARC layer reduces reflection of the exposure light used during the photolithography process to pattern a patterned mask (not shown), which reflection may cause inaccuracies in patterning. The ARC layer may be formed of a nitride material (e.g., silicon nitride), an organic material (e.g., silicon carbide), an oxide material, high-k dielectric, and/or the like.

Figure 13:
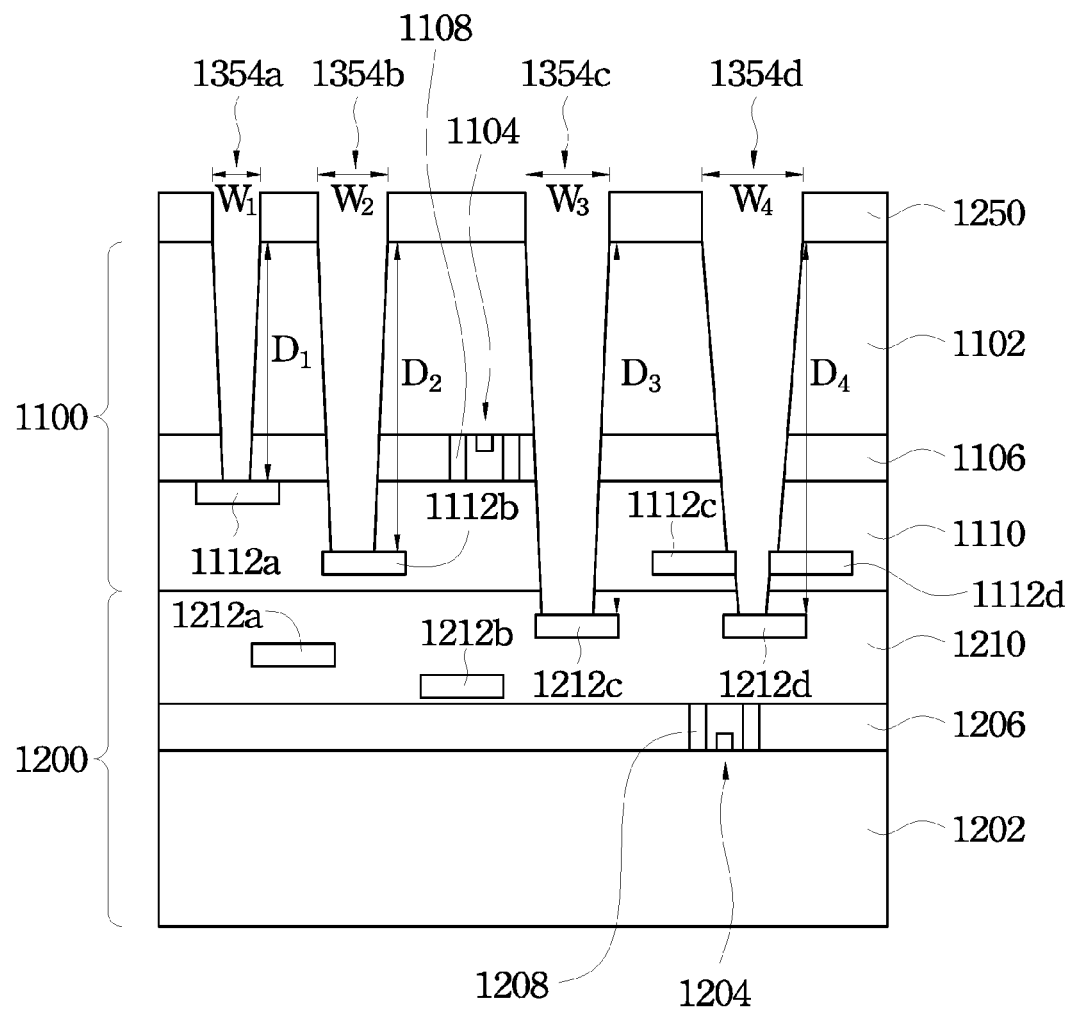

FIG. 13 illustrates formation of via openings 1354a-1354d (collectively referred to as via openings 1354) in accordance with some embodiments. In some embodiments, via openings 1354 may be formed substantially simultaneously using, for example, one or more suitable etching processes, such as a dry etch, an anisotropic wet etch, or any other suitable anisotropic etch or patterning process.

As illustrated in FIG. 13, widths of openings 1354 may be adjusted to account for differing depths of individual via openings 1354 and a tapering of sidewalls of openings 1354. For example, via opening 1354a has a shortest depth $D_1$, and accordingly has a smallest $W_1$, while via opening 1354b has a greater depth $D_2$, and accordingly has a greater width $W_2$. Via opening 1354c has the next greatest depth $D_3$, and has a width $W_3$ greater than width $W_2$. Via opening 1354d illustrates an interconnection formed between first interconnections 1112c-1112d on first wafer 100 and second interconnection 2112d on second wafer 200. Via opening 1354d has a width $W_4$ adjusted to accommodate depth $D_4$. In some embodiments, the varying widths of via openings 1354 allow for differing loading effects during etching such that varying depths of vias may occur substantially simultaneously with an etch.

Via openings 1354 may be formed to various metallization layers. For example, via opening 1354a may be formed to a first metallization layer (M1) interconnect line 1112a, and via opening 1354b may be formed to a top metallization layer (Mn) interconnect line 1112b. In a representative embodiment, M1 may comprise a lowermost metallization layer, and Mn may comprise an uppermost metallization layer. Via openings 1354 may also provide a substantially direct electrical connection to a metallization layer on second wafer 1200. For example, via opening 1354c illustrates an opening directly to a top metallization layer interconnect line 2112c on second wafer 1200. Via opening 1354d illustrates a via opening to interconnect lines on first wafer 1100 and second wafer 1200, such as first interconnect lines 1112c-d in a top metallization layer of first wafer 1100 and second interconnect lines 2112d in a top metallization layer of second wafer 1200. Electrical connections may be made to other metallization layers.

As illustrated in FIG. 13, opening 1354d extends to first interconnect lines 1112c-1112d and to second interconnect line 1212d. In an embodiment, first interconnect lines 1112c and 112d may be formed of suitable metal materials such as copper, which exhibits a different etching rate (selectivity) than first IMD layers 1110 and second IMD layers 1210. As such, first interconnect lines 1112c and 1112d function as a hard mask layer for the etching process to extend opening 1354d to second interconnect line 1212d. A selective etching process may be employed to etch first ILD layers 110 rapidly while etching only a portion of first interconnect lines 1112a and 1112b. An exposed portion of first interconnect lines 1112c and 1112d may be partially etched away, thereby forming a recess, as the etch process continues toward second interconnect line 1212d. The depth of the recess may vary depending on a variety of applications and design needs.

First interconnect lines 1112c and 1112d may be portions of a single interconnect. For example, first interconnect lines 1112c and 1112d may be a single conductive pad having a hole formed therethrough. In this manner, via opening 1354d extends through the hole in the single conductive pad, wherein the conductive pad acts as a hard mask for the continued etch to second interconnect line 1212d.

Figure 14:
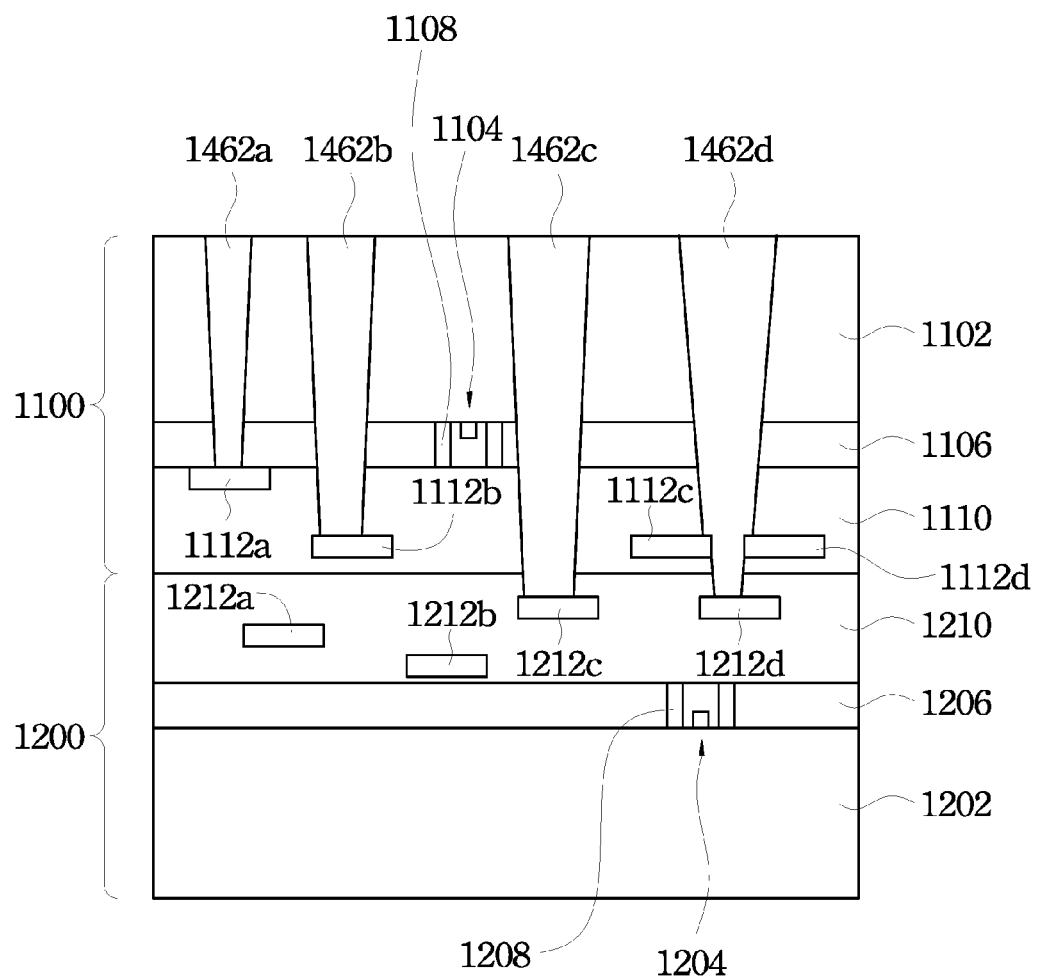

Referring now to FIG. 14, there is illustrated a conductive material formed within via openings 1354 in accordance with various embodiments. In some embodiments, the conductive material may be formed by depositing one or more diffusion and/or barrier layers and depositing a seed layer. For example, a diffusion barrier layer comprising one or more layers of Ta, TaN, TiN, Ti, CoW, and/or the like may be formed along sidewalls of via openings 1354. The seed layer may be formed of copper, nickel, gold, any combination thereof, and/or the like. The diffusion barrier layer and the seed layer may be formed by suitable deposition techniques such as PVD, CVD, and/or the like. Once the seed layer has been deposited in the openings, a conductive material, such as tungsten, titanium, aluminum, copper, any combinations thereof, and/or the like, may be filled into via openings 1354, using, for example, an electro-chemical plating process, thereby forming conductive plugs 1462a-d (collectively referred to as conductive plugs 1462).

FIG. 14 also illustrates removal of excess materials, e.g., excess conductive materials and/or excess materials of mask layer 1250, from the backside of first substrate 1102. In this example, excess material may be removed using an etch process, a planarization process (e.g., a CMP process), and/or the like. In some embodiments, a portion of mask layer 1250 may remain to protect the backside of first substrate 1102.

Embodiments such as those discussed above provide conductive plugs 1462 that can substantially directly couple conductive features on one or more wafers (e.g., first wafer 1100 and second wafer 1200) and may cross a bonding interface. Conductive plugs 1462 may interconnect circuitry on the wafers (e.g., first wafer 1100 and second wafer 1200). Further, conductive plugs 1462 may be formed through additional substrates, such as a third or fourth wafer.

Thereafter, further processing may be performed. For example, passivation layers, redistribution layers, under-bump metallization layers, and/or the like may be formed, and the structures may be singulated and/or packaged. Other processes may be performed and other structures may be formed.

Figure 15:
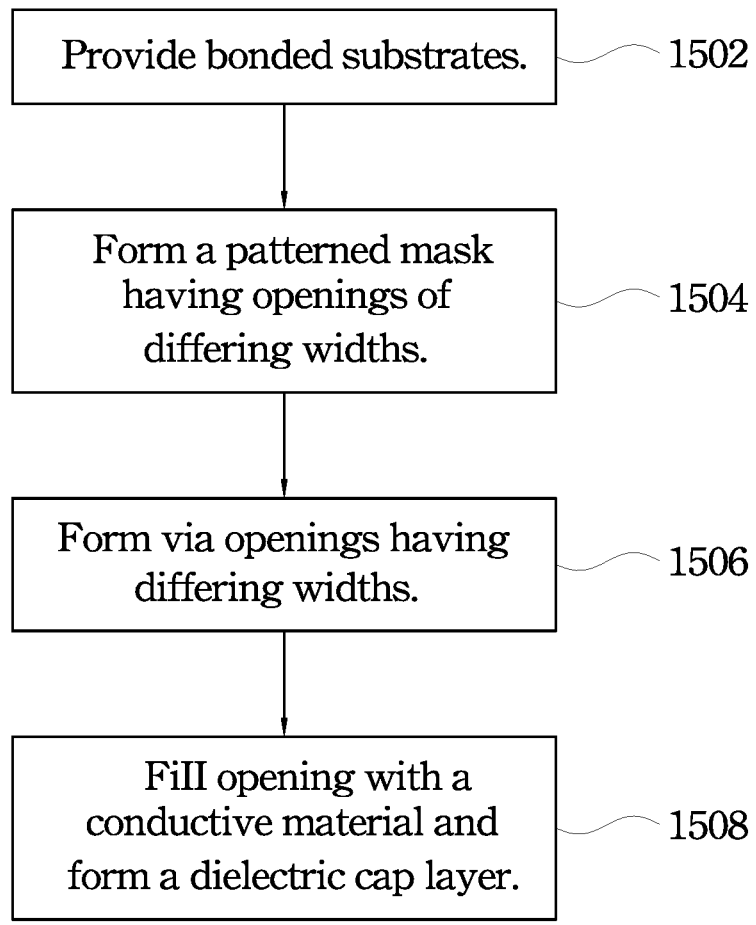
FIG. 15 is a flowchart illustrating example steps executed to implement a representative embodiment.

FIG. 15 is a flowchart illustrating representative steps that may be executed to implement one embodiment. In step 1502, bonded substrates are provided. In some embodiments, the bonded substrates include a first wafer and a second wafer bonded to each other. In some embodiments, the first wafer and the second wafer may be bonded such that the device sides of the wafers face each other. The bonded substrates may alternatively include chip-to-wafer or chip-to-chip configurations. In step 1504, a mask is formed over the first wafer, wherein the mask is patterned to have openings of varying widths. The openings represent a location of via openings to be formed in the first substrate. The widths of the openings may be determined in part by the desired depth of the via opening. The mask may include, for example, a photoresist, a hard mask, an ARC, and/or the like.

In step 1506, via openings are formed extending from a backside of the first substrate to interconnect structures formed on the first substrate and/or the second substrate in accordance with the patterned mask. Thereafter, in step 1508, the via openings are filled with a conductive material.

In accordance with a representative embodiment, a method includes grinding away substrate material from a backside of a semiconductor device. A current change may be detected in a grinding device responsive to exposure of a first set of device structures through the substrate material, where the grinding is stopped in response to the detected current change. Polishing continues to remove an additional amount of the substrate material. Exposure of one or more additional sets of device structures through the substrate material may be monitored to determine additional amounts of substrate material to remove, where the one or more additional sets of device structures may be located in the semiconductor device at a known depth different than the first set.

In accordance with another representative embodiment, a stacked semiconductor device includes two or more bonded semiconductor components in a stack having an exposed backside surface of a substrate. A plurality of device structures may be located within the substrate, where each device structure in the plurality has a known gradient depth in relation to the exposed backside surface.

In accordance with another representative embodiment, a method for determining a thickness of a thinned semiconductor device includes inspecting a thinned surface of the thinned semiconductor device to detect a pattern of device structures exposed through the thinned surface. The pattern may then be compared to a known gradient depth of each of the device structures in the pattern to identify the thickness of the semiconductor device.

In accordance with another representative embodiment, a method for thinning a semiconductor wafer includes grinding a backside surface of the semiconductor wafer to remove substrate material. The grinding may be terminated at a predetermined depth identified by a current change detected in the grinding machine responsive to a grinding pad contacting a first set of device structures exposed through the substrate material. The backside surface of the wafer may then be polished to further remove the substrate material. The polishing terminates at a desired depth also identified by one or more additional sets of device structures exposed through the substrate material. These additional sets of device structures may be positioned at a known gradient depth with respect to the first set.

In accordance with another representative embodiment, a wafer thinning machine includes one or more grinding elements each having a replaceable coarse grinding surface and one or more polishing elements, each having a replaceable fine grinding surface. There is a platen for rotatably and selectively positioning a semiconductor wafer under either the grinding elements or the polishing elements. A current sensor, associated with the grinding elements, detects any current changes caused by interaction between the semiconductor wafer and the grinding elements.

In accordance with another representative embodiment, a method for manufacturing a stacked integrated circuit includes forming a first set of device structures in a first wafer die, where the first set of device structures are formed having a first known depth relative to a backside surface for the first wafer die. One or more additional sets of device structures are formed in the first wafer die, where each of the additional sets of device structures is formed having a known additional depth graded in relation to the first depth, such that each set of device structures lies at a known different depth. The first wafer die is stacked onto another wafer die, where the front side of the first wafer die is bonded to the front-side of the other wafer die. The backside surface of the first wafer die is then thinned to a thickness identified by a pattern comprising ones of the sets of device structures exposed on the backside surface by the thinning.

In accordance with yet another embodiment, a representative device includes a bonded structure, the bonded structure having a first substrate with a first plurality of metallization layers disposed thereon, and a second substrate with a second plurality of metallization layers disposed thereon. A plurality of via openings are formed through the first substrate, the plurality of via openings comprising a first via opening having a first width and a second via opening having a second width, the first width being different than the second width. The device further includes a plurality of conductive plugs, the plurality of conductive plugs having a conductive plug in each via opening, the conductive plugs comprising a first conductive plug in the first via opening and a second conductive plug in the second via opening, where the first conductive plug comprises a substantially direct linear route through the first substrate from the first via opening to: (a) a first interconnect of the first plurality of metallization layers; and a second interconnect of the second plurality of metallization layers. The first interconnect is laterally offset away from the second interconnect in a direction substantially parallel to a major surface of the first substrate, and the substantially direct linear route is substantially perpendicular to the major surface of the first substrate.

An advantage of a representative embodiment is that coarse grinding may be accomplished with greater accuracy to the appropriate level without the physical limitations found in the mechanical thickness dial.

A further advantage of a representative embodiment is that after the wafer has been thinned, the pattern of device structures that have been exposed on the backside surface may be used to determine and/or verify the thickness of the thinned wafer.

In some embodiments, a method is provided. The method includes providing a bonded structure, wherein the bonded structure includes a first substrate having a first plurality of metallization layers disposed thereon and a second substrate having a second plurality of metallization layers disposed thereon. A plurality of via openings is formed through the first substrate, wherein the plurality of via openings comprising a first via opening have a first width and a second via opening have a second width, the first width being different than the second width. Thereafter, a plurality of conductive plugs may be formed such that the plurality of conductive plugs includes a conductive plug in each of the via openings. The conductive plugs further include a first conductive plug in the first via opening and a second conductive plug in the second via opening.

In some embodiments another method is provided. The method includes providing a first substrate having one or more first metallization layers disposed on a device side of the first substrate and a second substrate, the second substrate having one or more second metallization layers disposed on a device side of the second substrate. The first substrate is bonded to the second substrate such that device side of the first substrate faces the device side of the second substrate. A patterned mask is formed on a backside of the first substrate, such that the patterned mask has a first opening and a second opening. A first trench is formed in the first substrate in the first opening of the patterned mask, and a second trench is formed in the first substrate in the second opening of the patterned mask, the first trench having a first width less than a second width of the second trench. The first trench and the second trench are filled with conductive material, thereby forming a first conductive plug and a second conductive plug.

In some embodiments, a device is provided. The device includes a first substrate having a plurality of first metallization layers disposed thereon, and a second substrate having a plurality of second metallization layers. The first substrate is bonded to the second substrate. The device also includes a plurality of conductive plugs extending from a surface of the first substrate, wherein the plurality of conductive plugs includes a first conductive plug and a second conductive plug. The first conductive plug has a first width and a first depth, and the second conductive plug has a second width and a second depth, wherein the first width being greater than the second width and the first depth being greater than the second depth.

Although representative advantages have been described in detail, it should be understood that various changes, substitutions, and alterations can be made herein without departing from the spirit and scope of the disclosure as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A device comprising:
   a first substrate having a plurality of first metallization layers disposed thereon;
   a second substrate bonded to the first substrate, the second substrate having a plurality of second metallization layers;
   a plurality of conductive plugs extending from a surface of the first substrate, the plurality of conductive plugs comprising a first conductive plug and a second conductive plug, the first conductive plug having a first width and a first depth, the second conductive plug having a second width and a second depth, the second width being greater than the first width, the second depth being greater than the first depth; and a third conductive plug extending from the surface of the first substrate, the third conductive plug coupled to a first interconnect of the plurality of first metallization layers and to a second interconnect of the plurality of second metallization layers, wherein the first interconnect is over the second interconnect, the third conductive plug is disposed over an upper surface of the first interconnect, the third conductive plug is interposed between and is in contact with laterally disposed sidewalls of the first interconnect, the third conductive plug comprises a bottom-most surface contacting the second interconnect, and the third conductive plug comprises continuously tapering sidewalls over the upper surface of the first interconnect.

2. The device of claim 1, wherein the first conductive plug is coupled to a third interconnect of the plurality of first metallization layers, and wherein the second conductive plug is coupled to a fourth interconnect of the plurality of second metallization layers.

3. The device of claim 2, wherein the first conductive plug is in a lowermost metallization layer of the plurality of first metallization layers.

4. The device of claim 2, wherein the first conductive plug is in an uppermost metallization layer of the plurality of first metallization layers.

5. The device of claim 1, wherein the third conductive plug has a third width, the third width being greater than the first width.

6. The device of claim 1, wherein the first conductive plug is coupled to a third interconnect of the plurality of first metallization layers, and wherein the second conductive plug is coupled to a fourth interconnect of the plurality of first metallization layers.

7. The device of claim 1, wherein the first substrate comprises a backside illumination sensor (BIS).

8. The device of claim 7, wherein the second substrate comprises an application-specific integrated circuit (ASIC).

9. A device comprising:
a bonded structure, the bonded structure comprising a first substrate having a first plurality of metallization layers disposed thereon, and a second substrate having a second plurality of metallization layers disposed thereon; and
a plurality of conductive plugs through the first substrate, the conductive plugs comprising a first conductive plug having a first width and a second conductive plug having a second width different from the first width, wherein:
the first conductive plug comprises a substantially direct linear route through the first substrate to contact both:
a first interconnect of the first plurality of metallization layers; and
a second interconnect of the second plurality of metallization layers, the second interconnect under the first interconnect;
the first conductive plug is disposed over and on an upper surface of the first interconnect, wherein the first conductive plug comprises continuously tapered sidewalls above the upper surface of the first interconnect; and
the first interconnect extends along opposing sidewalls of the first conductive plug.

10. The device of claim 9, wherein the first interconnect is laterally offset away from the second interconnect in a direction substantially parallel to a major surface of the first substrate.

11. The device of claim 10, wherein, the substantially direct linear route is substantially perpendicular to the major surface of the first substrate.

12. The device of claim 9, wherein the first conductive plug has a first depth and the second conductive plug has a second depth, the first depth being greater than the second depth, the first width being greater than the second width.

13. The device of claim 9, wherein the second conductive plug electrically couples a first interconnect of the first plurality of metallization layers to a second interconnect of the second plurality of metallization layers.

14. The device of claim 9, wherein:
the plurality of conductive plugs comprises a third conductive plug;
the third conductive plug extends from a backside of the first substrate to a third interconnect in a first metallization layer of the first plurality of metallization layers; and
the second conductive plug extends from the backside of the first substrate to a fourth interconnect in a second metallization layer of the first plurality of metallization layers, the first metallization layer being different than the second metallization layer.

15. A device comprising:
a first substrate, the first substrate having a first conductive feature in a first metallization layer disposed on a device side of the first substrate;
a second substrate, the second substrate having a second conductive feature in a second metallization layer disposed on a device side of the second substrate, wherein the first substrate is bonded to the second substrate such that the device side of the first substrate faces the device side of the second substrate;
a first conductive plug extending from a backside of the first substrate to the first conductive feature, the first conductive plug having a first width; and
a second conductive plug extending from the backside of the first substrate to a third conductive feature in the first metallization layer and to the second conductive feature, the second conductive feature underlying and being vertically aligned with the third conductive feature, the second conductive plug having a second width, the second width being greater than the first width, wherein the first conductive plug is electrically isolated from the second conductive plug, the second conductive plug is disposed over and is in contact with an upper surface and sidewalls of the third conductive feature, and the second conductive plug has continuously tapered sidewalls from the upper surface of the third conductive feature to the backside of the first substrate.

16. The device of claim 15, wherein the first conductive plug has a first depth and the second conductive plug has a second depth, the first depth being less than the second depth.

17. The device of claim 15, further comprising:
a third conductive plug extending from the backside of the first substrate to a fourth conductive feature in a third metallization layer, the third metallization layer being interposed between the first metallization layer and the second metallization layer, the third conductive plug having a third width, the third width being greater than the first width and less than the second width.

18. The device of claim 17, wherein the third metallization layer is a metallization layer of the first substrate.

19. The device of claim 17, wherein the third metallization layer is a metallization layer of the second substrate.

20. The device of claim 15, wherein the second conductive plug passes through a hole in the third conductive feature.

\* \* \* \* \*